(12) United States Patent
Mitsuzuka et al.

(10) Patent No.: US 12,439,622 B2
(45) Date of Patent: Oct. 7, 2025

(54) SEMICONDUCTOR DEVICE AND MANUFACTURING METHOD OF SEMICONDUCTOR DEVICE

(71) Applicant: FUJI ELECTRIC CO., LTD., Kawasaki (JP)

(72) Inventors: Kaname Mitsuzuka, Matsumoto (JP); Tohru Shirakawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 335 days.

(21) Appl. No.: 18/069,203

(22) Filed: Dec. 20, 2022

(65) Prior Publication Data

US 2023/0246097 A1   Aug. 3, 2023

(30) Foreign Application Priority Data

Feb. 2, 2022   (JP) ................. 2022-015236

(51) Int. Cl.
*H10D 12/00*   (2025.01)
*H01L 21/265*   (2006.01)
(Continued)

(52) U.S. Cl.
CPC ..... *H10D 12/491* (2025.01); *H01L 21/26506* (2013.01); *H10D 12/038* (2025.01);
(Continued)

(58) Field of Classification Search
CPC ............ H01L 21/26506; H10D 62/393; H10D 64/231; H10D 12/481; H10D 62/127; H10D 62/145; H10D 64/117; H10D 12/411–491; H10D 12/031–038; H10D 62/141–148; H10D 8/00–825; H10D 62/60–605
See application file for complete search history.

(56) References Cited

U.S. PATENT DOCUMENTS

2013/0001638 A1   1/2013   Yoshikawa
2017/0141217 A1   5/2017   Shirakawa
(Continued)

FOREIGN PATENT DOCUMENTS

JP   2005175062 A   6/2005
JP   2018195798 A   12/2018
(Continued)

*Primary Examiner* — Shahed Ahmed

(57) ABSTRACT

Provided is a semiconductor device including a gate trench portion and a first trench portion adjacent to the gate trench portion. The device may include a first conductivity type drift region provided in a semiconductor substrate, a second conductivity type base region provided above the drift region, a first conductivity type emitter region provided above the base region and having a doping concentration higher than that of the drift region, and a second conductivity type contact region provided above the base region and having a doping concentration higher than that of the base region. The contact region includes a first contact portion provided on a front surface of the substrate, and a second contact portion having a doping concentration different from that of the first contact portion and provided alternately with the first contact portion in a trench extending direction on a side wall of the first trench portion.

23 Claims, 23 Drawing Sheets

(51) Int. Cl.
   *H10D 12/01*     (2025.01)
   *H10D 62/13*     (2025.01)
   *H10D 62/17*     (2025.01)
   *H10D 64/23*     (2025.01)

(52) U.S. Cl.
   CPC ......... *H10D 62/133* (2025.01); *H10D 62/393* (2025.01); *H10D 64/231* (2025.01)

(56) References Cited

U.S. PATENT DOCUMENTS

| | | | |
|---|---|---|---|
| 2018/0374948 A1 | 12/2018 | Naito | |
| 2020/0335497 A1* | 10/2020 | Mitsuzuka | H10D 62/393 |
| 2021/0359116 A1* | 11/2021 | Yoshida | H10D 84/617 |
| 2022/0122966 A1* | 4/2022 | Nishi | H10D 62/126 |
| 2022/0328669 A1 | 10/2022 | Mitsuzuka | |

FOREIGN PATENT DOCUMENTS

| | | | |
|---|---|---|---|
| WO | 2012073609 A1 | 6/2012 |
| WO | 2016133027 A1 | 8/2016 |
| WO | 2018052098 A1 | 3/2018 |
| WO | 2022004084 A1 | 1/2022 |

* cited by examiner

SEMICONDUCTOR DEVICE AND MANUFACTURING METHOD OF SEMICONDUCTOR DEVICE

The contents of the following Japanese patent application(s) are incorporated herein by reference:
NO. 2022-015236 filed in JP on Feb. 2, 2022

BACKGROUND

1. Technical Field

The present invention relates to a semiconductor device and a manufacturing method of a semiconductor device.

2. Related Art

Patent Document 1 describes that "the contact region is provided below a lower end of an emitter region".

PRIOR ART DOCUMENTS

Patent Documents

Patent Document 1: PCT International Publication No. 2022/004084
Patent Document 2: Japanese Patent Application Publication No. 2018-195798
Patent Document 3: PCT International Publication No. 2018/052098

A semiconductor device with improved latch-up withstand capability during switching is provided.

DESCRIPTION OF EXEMPLARY EMBODIMENTS

Hereinafter, the present invention will be described through embodiments of the invention, but the following embodiments do not limit the invention according to the claims. In addition, not all combinations of the features described in the embodiments necessarily have to be essential to solving means of the invention.

In the present specification, one side in a direction parallel to a depth direction of a semiconductor substrate is referred to as "upper", and the other side is referred to as "lower". One surface of two principal surfaces of a substrate, a layer, or some other member is referred to as a front surface, and the other surface is referred to as a back surface. The "upper", "lower", "front", and "back" directions are not limited to the gravitational direction or the direction of attachment to a substrate or the like at the time of mounting of a semiconductor device.

In the present specification, the technical matters may be described using orthogonal coordinate axes of an X axis, a Y axis, and a Z axis. In the present specification, the X-Y plane is the plane parallel to the front surface of the semiconductor substrate, and the Z axis is the direction that forms a right-handed system with the X axis and the Y axis and is parallel to the depth direction of the semiconductor substrate.

Although, in each example embodiment, a first conductivity type is exemplified as N type, and a second conductivity type is exemplified as P type, the first conductivity type may be P type, and the second conductivity type may be N type. In this case, the conductivity type of the substrate, layers, regions, and the like in each example embodiment respectively are of the opposite polarity.

In the present specification, it is meant that the electrons or holes are majority carriers in the layers or regions specified with N or P, respectively. Also, '+' and '-' attached to 'N' and 'P' respectively mean a higher doping concentration and a lower doping concentration than the layer or region to which these symbols are not attached.

Figure 1A:
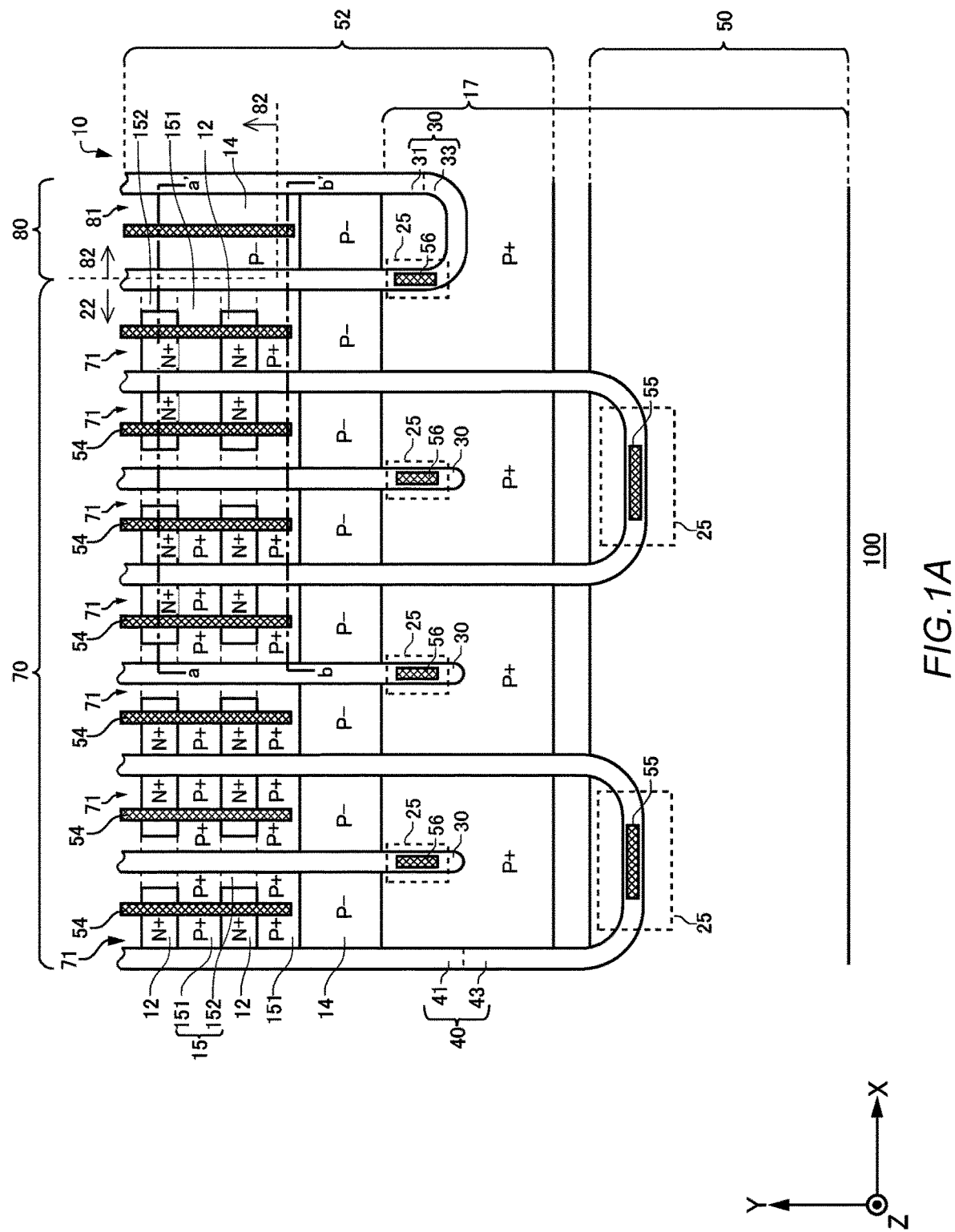
FIG. 1A shows an example of a top view of a semiconductor device 100.

FIG. 1A shows an example of a top view of a semiconductor device 100. The semiconductor device 100 in the present example is a semiconductor chip including a transistor portion 70 and a diode portion 80. For example, the semiconductor device 100 is a trench gate type RC-IGBT (Reverse Conducting Insulated Gate Bipolar Transistor) in which a plurality of trench portions are arrayed. In the present example, the plurality of trench portions are in a striped pattern in which the trench portions are arrayed in the X axis direction and extend in the Y axis direction.

The transistor portion 70 is the region of the collector region 22 provided on the back surface side of the semiconductor substrate 10 projected onto the upper surface of the semiconductor substrate 10, as will be described later in FIG. 1B. The collector region 22 has the second conductivity type. The collector region 22 of the present example is of P+ type, by way of example. The transistor portion 70 includes a transistor such as an IGBT.

The diode portion 80 is the region of the cathode region 82 provided on the back surface side of the semiconductor substrate 10 projected onto the upper surface of the semiconductor substrate 10, as will be described later in FIG. 1B. The cathode region 82 has the first conductivity type. The cathode region 82 of the present example is of N+ type, by way of example. The diode portion 80 includes diodes such as free wheel diodes (FWDs) provided adjacent to the transistor portion 70 on the upper surface of the semiconductor substrate 10.

FIG. 1A shows a surrounding region of a chip end portion, which is an edge side of the semiconductor device 100, and the other regions are omitted. For example, an edge termination structure portion is provided in the region on the negative side of the Y axis direction in the semiconductor device 100 in the present example. The edge termination structure portion reduces the electric field strength on the upper surface side of the semiconductor substrate 10. The edge termination structure portion includes, for example, a guard ring, a field plate, or a RESURF structure, or combinations thereof. It is to be noted that although the present example describes the edge on the negative side in the Y axis direction for convenience, the same applies to other edges of the semiconductor device 100.

The semiconductor substrate 10 may be a silicon substrate, may be a silicon carbide substrate, or may be a nitride semiconductor substrate such as gallium nitride, or the like. The semiconductor substrate 10 of the present example is a silicon substrate.

The semiconductor device 100 of the present example includes a gate trench portion 40, a dummy trench portion 30, an emitter region 12, a base region 14, a contact region 15, and a well region 17, on the front surface of the semiconductor substrate 10. Also, the semiconductor device 100 of the present example includes an emitter electrode 52 and a gate metal layer 50, which are provided above the front surface of the semiconductor substrate 10.

The emitter electrode 52 is provided above the gate trench portion 40, the dummy trench portion 30, the emitter region 12, the base region 14, the contact region 15, and the well region 17. In addition, the gate metal layer 50 is provided above the gate trench portion 40 and the well region 17.

The emitter electrode 52 and the gate metal layer 50 are formed of a material including metal. For example, at least a partial region of the emitter electrode 52 is formed of aluminum, aluminum-silicon alloy, or aluminum-silicon-copper alloy. At least a partial region of the gate metal layer 50 may be formed of aluminum, aluminum-silicon alloy, or aluminum-silicon-copper alloy. The emitter electrode 52 and the gate metal layer 50 may include a barrier metal formed of titanium, titanium compound, and the like under the region formed of aluminum and the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1A. The interlayer dielectric film 38 is provided with contact holes 54, contact holes 55, and contact holes 56 penetrating therethrough.

The contact hole 55 connects the gate metal layer 50 and the gate conductive portion inside the gate trench portion 40 of the transistor portion 70. Inside the contact hole 55, a plug formed of tungsten or the like may be formed.

The contact hole 56 connects the emitter electrode 52 and a dummy conductive portion inside the dummy trench portion 30. Inside the contact hole 56, a plug formed of tungsten or the like may be formed.

The connecting portion 25 electrically connects a front surface side electrode such as the emitter electrode 52 or the gate metal layer 50 and the semiconductor substrate 10. In one example, the connecting portion 25 is provided between the gate metal layer 50 and the gate conductive portion. The connecting portion 25 is also provided between the emitter electrode 52 and the dummy conductive portion. The connecting portion 25 is formed of a conductive material such as polysilicon doped with impurities. Herein, the connecting portion 25 is formed of polysilicon (N+) doped with N type impurities. The connecting portion 25 is provided above the front surface of the semiconductor substrate 10 via a dielectric film such as an oxide film, or the like.

The gate trench portions 40 are arrayed at predetermined intervals along a trench array direction (the X axis direction in the present example). As one example, the gate trench portions 40 are arrayed at a trench interval of 1.5 μm from adjacent trench portions, but the trench interval is not limited to this interval. The gate trench portion 40 of the present example may have two extending portions 41 extending along the trench extending direction perpendicular to the trench array direction and parallel to the front surface of the semiconductor substrate 10 (the Y axis direction in the present example), and a connection portion 43 for connecting the two extending portions 41.

Preferably, at least a part of the connection portion 43 is formed in a curved shape. When the end portions of the two extending portions 41 of the gate trench portion 40 are connected to each other, the electric field strength at the end portions of the extending portions 41 can be reduced. At the connection portion 43 of the gate trench portion 40, the gate metal layer 50 may be connected to the gate conductive portion.

The dummy trench portion 30 in the present example is a trench portion that is electrically connected to the emitter electrode 52 and is set at an emitter potential. Similar to the gate trench portions 40, the dummy trench portions 30 are arrayed at predetermined intervals along the trench array direction (the X axis direction in the present example). As one example, the dummy trench portions 30 are arrayed at a trench interval of 1.5 μm from adjacent trench portions, but the trench interval is not limited to this interval. The trench interval of the dummy trench portions 30 may differ from the trench interval of the gate trench portions 40. Similar to the gate trench portion 40, the dummy trench portion 30 of the present example may have a U shape on the front surface of the semiconductor substrate 10. That is, the dummy trench portion 30 may have two extending portions 31 extending along the trench extending direction, and a connection portion 33 for connecting the two extending portions 31. The dummy trench portion 30 may be set at a floating potential where it is not set at a predetermined potential. The dummy trench portion 30 is an example of a first trench portion adjacent to the gate trench portion 40.

As described above, the first trench portion adjacent to the gate trench portion 40 may be the dummy trench portion 30 set at an emitter potential. The first trench portion adjacent to the gate trench portion 40 may be the gate trench portion 40 set at a gate potential. Further, the first trench portion adjacent to the gate trench portion 40 may be a dummy gate trench portion 130 that is set at a gate potential and is not in contact with the emitter region 12. The dummy gate trench portion 130 will be described later.

The transistor portion 70 in the present example has a structure in which two gate trench portions 40 including the connection portion 43 and two dummy trench portions 30 not including the connection portion are repeatedly arrayed. That is, the array ratio of the gate trench portions 40 and the dummy trench portion 30 may be set at a desired array ratio. In the transistor portion 70 in the present example, the ratio of the number of gate trench portions 40 and the number of dummy trench portions 30 is 1:1. The transistor portion 70 in the present example has the dummy trench portion 30 between the two extending portions 41 connected by the connection portion 43. It is to be noted that the number of gate trench portions 40 may be the number of extending portions 41. The number of dummy trench portions 30 may be the number of extending portions 31.

However, the ratio of the gate trench portions 40 and the dummy trench portions 30 is not limited to the present example. The ratio of the gate trench portions 40 and the dummy trench portions 30 may be 2:3, or may be 2:4. By increasing the number of dummy trench portions 30 with respect to the gate trench portions 40, the electric field strength in the mesa portion 71 can be reduced, and the withstand capability of the voltage and the current of the semiconductor device 100 can be increased. Also, by adjusting the ratio of the gate trench portions 40 and the dummy trench portions 30, the gate capacitance for driving the semiconductor device 100 can be adjusted. By increasing the dummy trench portions 30 with respect to the gate trench portions 40, the gate capacitance is increased, and the saturation current is decreased. Also, in the transistor portion 70, a so-called full-gate structure in which the dummy trench portion 30 is not provided and all the trench portions are the gate trench portions 40 may be adopted. It is to be noted that the ratio of the gate trench portions 40 and the dummy trench portions 30 disclosed in the present specification may be read as a ratio of the gate trench portions 40 and dummy trenches. The dummy trenches include trenches that do not have channels formed in side walls, such as the dummy trench portion 30 or the dummy gate trench portion 130 to be described later.

The well region 17 is a region of a second conductivity type, that is provided closer to the front surface of the semiconductor substrate 10 than the drift region 18 to be described later. The well region 17 is of P+ type, by way of example. The well region 17 is formed within a predetermined range from an end portion of an active region on a side on which the gate metal layer 50 is provided. The well region 17 may have a diffusion depth larger than the depths of the gate trench portion 40 and the dummy trench portion 30. Partial regions of the gate trench portion 40 and the dummy trench portion 30 on the gate metal layer 50 side are formed in the well region 17. The bottoms of ends of the gate trench portions 40 and the dummy trench portions 30 in the trench extending direction may be covered by the well region 17.

The contact hole 54 is formed above each region of the emitter region 12 and the contact region 15 in the transistor portion 70. The emitter region 12 and the contact region 15 are exposed in the contact hole 54. The contact hole 54 is not provided above the well regions 17 provided at both ends of the Y axis direction. In this manner, one or more contact holes 54 are formed in the interlayer dielectric film 38. The one or more contact holes 54 may be provided to extend in the trench extending direction.

The mesa portion 71 and the mesa portion 81 are mesa portions provided adjacent to the trench portion within a plane parallel to the front surface of the semiconductor substrate 10. The mesa portion may be a portion of the semiconductor substrate 10 sandwiched by two trench portions that are adjacent to each other, and may be a portion from the front surface of the semiconductor substrate 10 down to the depth of the bottom portion, which is the deepest portion, of each trench portion. The extending portion of each trench portion may be set to be one trench portion. That is, the region sandwiched between two extending portions may be set to be a mesa portion.

The mesa portion 71 is provided adjacent to at least one of the dummy trench portion 30 or the gate trench portion 40 in the transistor portion 70. The mesa portion 71 has the well region 17, the emitter region 12, the base region 14, and the contact region 15 on the front surface of the semiconductor substrate 10.

On the other hand, the mesa portion 81 is provided adjacent to the dummy trench portion 30 in the diode portion 80. The trench portion in the mesa portion 81 may be electrically connected to the emitter electrode 52 through the contact hole 56 and set at the emitter potential. That is, the trench portion provided in the diode portion 80 may be the dummy trench portion 30.

The mesa portion 81 has the well region 17 and the base region 14 on the front surface of the semiconductor substrate 10. It is to be noted that the emitter electrode 52 is also arranged on the upper surface of the mesa portion 81. That is, the metal layer of the emitter electrode 52 may function as an anode electrode in the diode portion 80.

The base region 14 is a region of the second conductivity type, that is provided on the front surface side of the semiconductor substrate 10 in the transistor portion 70. The base region 14 is of P-type, by way of example. The base region 14 may be provided at both end portions of the mesa portion 71 in the Y axis direction on the front surface of the semiconductor substrate 10. It is to be noted that the present figure shows only one end portion of the base region 14 in the Y axis direction.

The emitter region 12 is a region of the first conductivity type, that has a higher doping concentration than the drift region 18 to be described later. The emitter region 12 of the present example is of N+ type, by way of example. For example, the dopant of the emitter region 12 is phosphorus (P), arsenic (As), or the like. The emitter region 12 is provided in contact with the gate trench portion 40 on the front surface of the mesa portion 71. The emitter region 12 may be provided to extend from one trench portion to the other trench portion of two trench portions sandwiching the mesa portion 71 in the X axis direction. The emitter region 12 is also provided below the contact hole 54. The emitter region 12 is connected to the emitter electrode 52 via the contact hole 54 provided while penetrating through the interlayer dielectric film 38.

The emitter region 12 may extend to the dummy trench portion 30 and be in contact with the dummy trench portion 30. It is to be noted that the emitter region 12 may be terminated before reaching the dummy trench portion 30 and may not be in contact with the dummy trench portion 30. The emitter region 12 in the present example is not in contact with the dummy trench portion 30.

The contact region 15 is a region of the second conductivity type, that has a higher doping concentration than the base region 14. The contact region 15 of the present example is of P+ type, by way of example. An example of the dopant of the contact region 15 is boron (B). The contact region 15 in the present example is provided on the front surface of the mesa portion 71. The contact region 15 may be provided from one trench portion to the other trench portion of two trench portions sandwiching the mesa portion 71 in the X axis direction. It is to be noted that the contact region 15 may be set apart from the gate trench portion 40 below the emitter region 12 in the portion where the emitter region 12 is in contact with the gate trench portion 40.

The contact region 15 may be or may not be in contact with the gate trench portion 40. Moreover, the contact region 15 may be or may not be in contact with the dummy trench portion 30. In the present example, the contact region 15 is in contact with the dummy trench portion 30 and the gate trench portion 40. The contact region 15 is also provided below the contact hole 54. It is to be noted that the contact region 15 may also be provided in the mesa portion 81. The contact region 15 of the present example includes a first contact portion 151 and a second contact portion 152.

The first contact portion 151 and the second contact portion 152 are provided alternately in the trench extending direction. The first contact portion 151 and the second contact portion 152 of the present example are provided alternately in the trench extending direction at a side wall of the dummy trench portion 30. The first contact portion 151 and the second contact portion 152 may be in contact with the side wall of the dummy trench portion 30. The first contact portion 151 may be sandwiched by the emitter regions 12 in the trench extending direction. The first contact portion 151 and the second contact portion 152 may be provided on the front surface of the semiconductor substrate 10, at the side wall of the dummy trench portion 30 which is the first trench portion.

The first contact portion 151 is provided on the front surface of the semiconductor substrate 10. On the front surface of the semiconductor substrate 10, the first contact portion 151 may be provided to extend from the gate trench portion 40 to the dummy trench portion 30 which is the first trench portion. That is, the first contact portion 151 of the present example is provided in contact with the gate trench portion 40 and the dummy trench portion 30.

On the front surface of the semiconductor substrate 10, the second contact portion 152 is provided between the emitter region 12 and the dummy trench portion 30 which is the first trench portion. On the front surface of the semiconductor substrate 10, the second contact portion 152 may be set apart from the gate trench portion 40 while being in contact with the dummy trench portion 30.

The first contact portion 151 and the second contact portion 152 have doping concentrations that are different from each other. For example, the doping concentration of the first contact portion 151 is $5E19/cm^3$ or more and $2E20/cm^3$ or less. The doping concentration of the second contact portion 152 may be $5E19/cm^3$ or more and $2E20/cm^3$ or less. It is to be noted that E means exponentiations of 10, for example, $5E19/cm^3$ means $5\times10^{19}/cm^3$.

The doping concentration of the first contact portion 151 may be higher than the doping concentration of the second contact portion 152. Accordingly, it becomes possible to reduce a contact resistance with the metal layer and facilitate hole extraction in the emitter electrode 52. Alternatively, the doping concentration of the first contact portion 151 may be lower than the doping concentration of the second contact portion 152.

The doping concentration of the second contact portion 152 may be lower than the doping concentration of the emitter region 12. Accordingly, even when the second contact portion 152 is ion-implanted into the same region as the emitter region 12, it is possible for the emitter region 12 to remain on the front surface of the semiconductor substrate 10. In one example, the doping concentration of the second contact portion 152 is higher than the doping concentration of the first contact portion 151 and lower than the doping concentration of the emitter region 12.

Figure 1B:
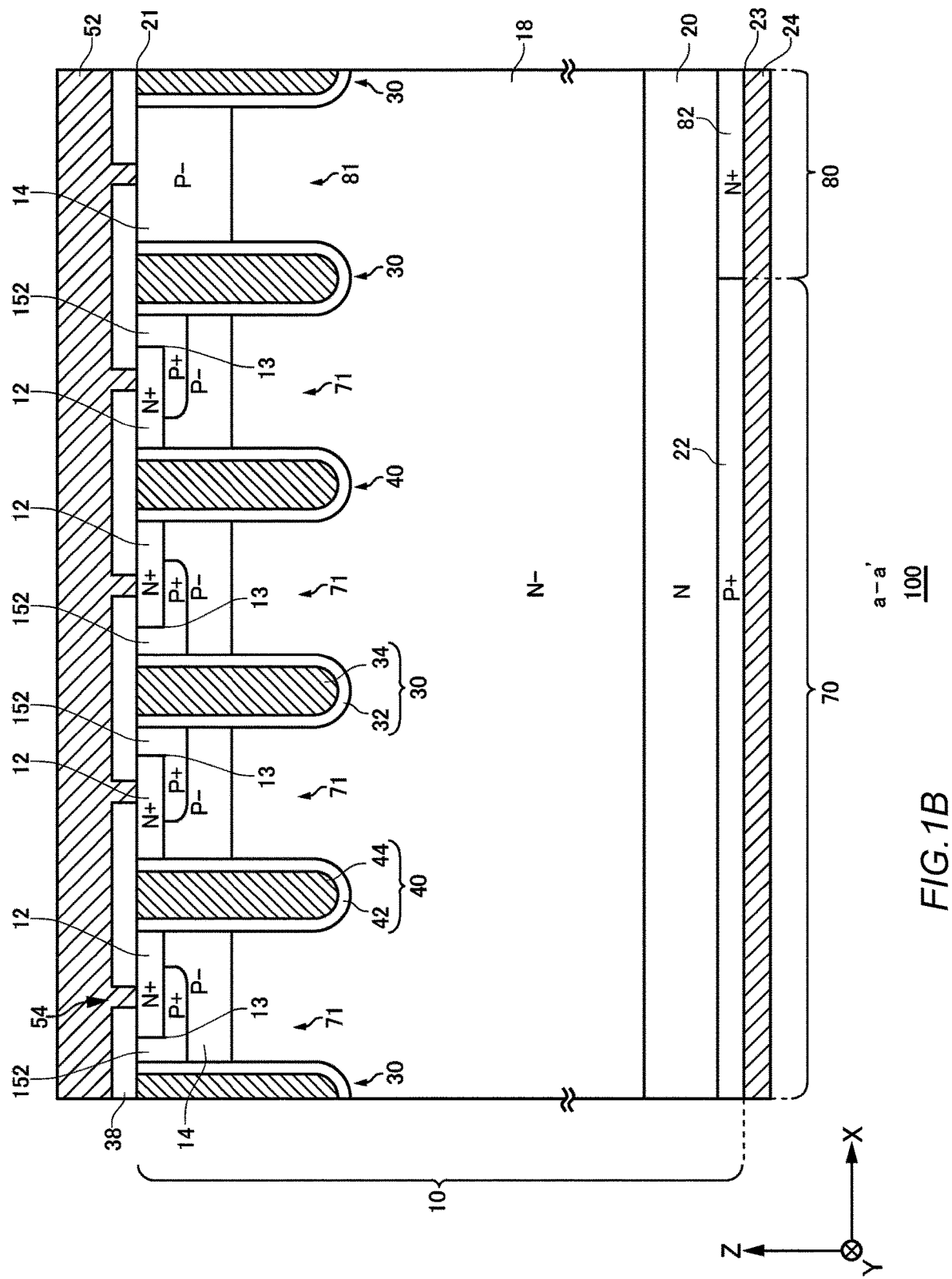
FIG. 1B shows an example of an a-a' cross sectional view in FIG. 1A.

FIG. 1B shows an example of an a-a' cross sectional view in FIG. 1A. The a-a' cross section is the X-Z plane that passes through the emitter region 12 and the second contact portion 152 in the transistor portion 70 and passes through the base region 14 in the diode portion 80. In the a-a' cross section, the semiconductor device 100 of the present example includes the semiconductor substrate 10, the interlayer dielectric film 38, the emitter electrode 52, and the collector electrode 24. The emitter electrode 52 is formed above the semiconductor substrate 10 and the interlayer dielectric film 38.

The drift region 18 is a region of the first conductivity type, that is provided in the semiconductor substrate 10. The drift region 18 of the present example is of N-type, by way of example. The drift region 18 may be a region that has remained without other doping regions being formed in the semiconductor substrate 10. That is, the doping concentration of the drift region 18 may be a doping concentration of the semiconductor substrate 10.

The buffer region 20 is a region of the first conductivity type, that is provided below the drift region 18. The buffer region 20 of the present example is of N type, by way of example. The doping concentration of the buffer region 20 is higher than the doping concentration of the drift region 18. The buffer region 20 may serve as a field stop layer which prevents a depletion layer spreading from the lower surface side of the base region 14 from reaching the collector region 22 of the second conductivity type and the cathode region 82 of the first conductivity type.

The collector region 22 is provided below the buffer region 20 in the transistor portion 70. The collector electrode 24 is formed on the back surface 23 of the semiconductor substrate 10. The collector electrode 24 is formed of a conductive material such as metal.

The base region 14 is a region of the second conductivity type, that is provided above the drift region 18 in the mesa portion 71 and the mesa portion 81. The base region 14 is provided in contact with the gate trench portion 40. The base region 14 may be provided in contact with the dummy trench portion 30.

The emitter region 12 is, in the mesa portion 71, provided between the base region 14 and the front surface 21. The emitter region 12 is provided in contact with the gate trench portion 40. The emitter region 12 may be or may not be in contact with the dummy trench portion 30.

One or more gate trench portions 40 and one or more dummy trench portions 30 are provided on the front surface 21. Each trench portion is provided to extend from the front surface 21 to the drift region 18. In regions provided with at least any of the emitter region 12, the base region 14, and the contact region 15, each trench portion also penetrates through these regions and reaches the drift region 18. The configuration of the trench portion penetrating through the doping region is not limited to the one manufactured in the order of forming the doping region and then forming the trench portion. The configuration of the trench portion penetrating through the doping region also includes a configuration of the doping region being formed between the trench portions after forming the trench portions.

The gate trench portion 40 has a gate trench, a gate dielectric film 42, and a gate conductive portion 44 formed on the front surface 21. The gate dielectric film 42 is formed to cover the inner wall of the gate trench. The gate dielectric film 42 may be formed by oxidizing or nitriding a semiconductor on the inner wall of the gate trench. The gate conductive portion 44 is formed more on the inner side than the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21. A potential of a gate electrode of an IGBT or the like is applied to the gate conductive portion 44.

The gate conductive portion 44 includes a region opposing the adjacent base region 14 on the mesa portion 71 side with the gate dielectric film 42 interposed therebetween, in the depth direction of the semiconductor substrate 10. When a predetermined gate voltage is applied to the gate conductive portion 44, a channel as an inversion layer of electrons is formed in the interfacial surface layer of the base region 14 in contact with the gate trench.

The dummy trench portion 30 may have the same structure as the gate trench portion 40. The dummy trench portion 30 includes a dummy trench, a dummy dielectric film 32, and a dummy conductive portion 34 formed on the front surface 21 side. The dummy dielectric film 32 is formed to cover the inner wall of the dummy trench. The dummy conductive portion 34 is formed more on the inner side than the dummy dielectric film 32 and formed inside the dummy trench. The dummy dielectric film 32 insulates the dummy conductive portion 34 from the semiconductor substrate 10. The dummy trench portion 30 is covered by the interlayer dielectric film 38 on the front surface 21. An emitter potential of an IGBT or the like is applied to the dummy conductive portion 34. The dummy conductive portion 34 may be set at a floating potential.

The interlayer dielectric film 38 is provided above the semiconductor substrate 10. The emitter electrode 52 is provided above the interlayer dielectric film 38. In the interlayer dielectric film 38, one or more contact holes 54 are provided for electrically connecting the emitter electrode 52 with the semiconductor substrate 10. The contact hole 55 and the contact hole 56 may similarly be provided while penetrating through the interlayer dielectric film 38.

The lower-end end portion 13 is a lower end of the emitter region 12 in the mesa portion 71, and is the lower end on the dummy trench portion 30 side. When the emitter region 12 reaches the dummy trench portion 30, the lower-end end portion 13 comes into contact with the dummy trench portion 30.

The second contact portion 152 is provided below the emitter region 12. The second contact portion 152 may be provided below the lower-end end portion 13 in the mesa portion 71.

The second contact portion 152 of the present example is provided to extend from the dummy trench portion 30 which is the first trench portion to below the lower end of the emitter region 12 in the trench array direction. Accordingly, it becomes difficult for holes below the emitter region 12 to be extracted directly through the emitter region 12. Accordingly, it becomes difficult for NPNP-type parasitic thyristors from the emitter region 12 to the collector region 22 to turn on, thereby enabling latch-up of the semiconductor device 100 to be suppressed.

The second contact portion 152 of the present example is, below the emitter region 12, set apart from the gate trench portion 40. Accordingly, the second contact portion 152 does not inhibit formation of an inversion layer on a side surface of the gate trench portion 40, and thus it becomes easy to stably operate the semiconductor device 100.

The second contact portion 152 of the present example is provided across both sides of the dummy trench portion 30 in the trench array direction. Accordingly, in a manufacturing process of the second contact portion 152, ion implantation can be performed so as to cross the regions where the dummy trench portions 30 are to be formed. The dummy trench portion 30 may be provided by etching the semiconductor substrate 10 after forming the second contact portion 152. Accordingly, even when the intervals of the mesa portions 71 are shortened for miniaturization of the semiconductor device 100 or the like, it becomes easy to manufacture the second contact portion 152 that extends to below the lower-end end portion 13 of the emitter region 12 and is set apart from the gate trench portion 40.

In the diode portion 80, the buffer region 20 is stacked above the cathode region 82, and the drift region 18 is stacked above the buffer region 20. In the mesa portion 81, the base region 14 is stacked above the drift region 18, and a PN junction is formed between the base region 14 and the drift region 18. The base region 14 is connected electrically to the emitter electrode 52 via the contact hole 54.

Figure 1C:
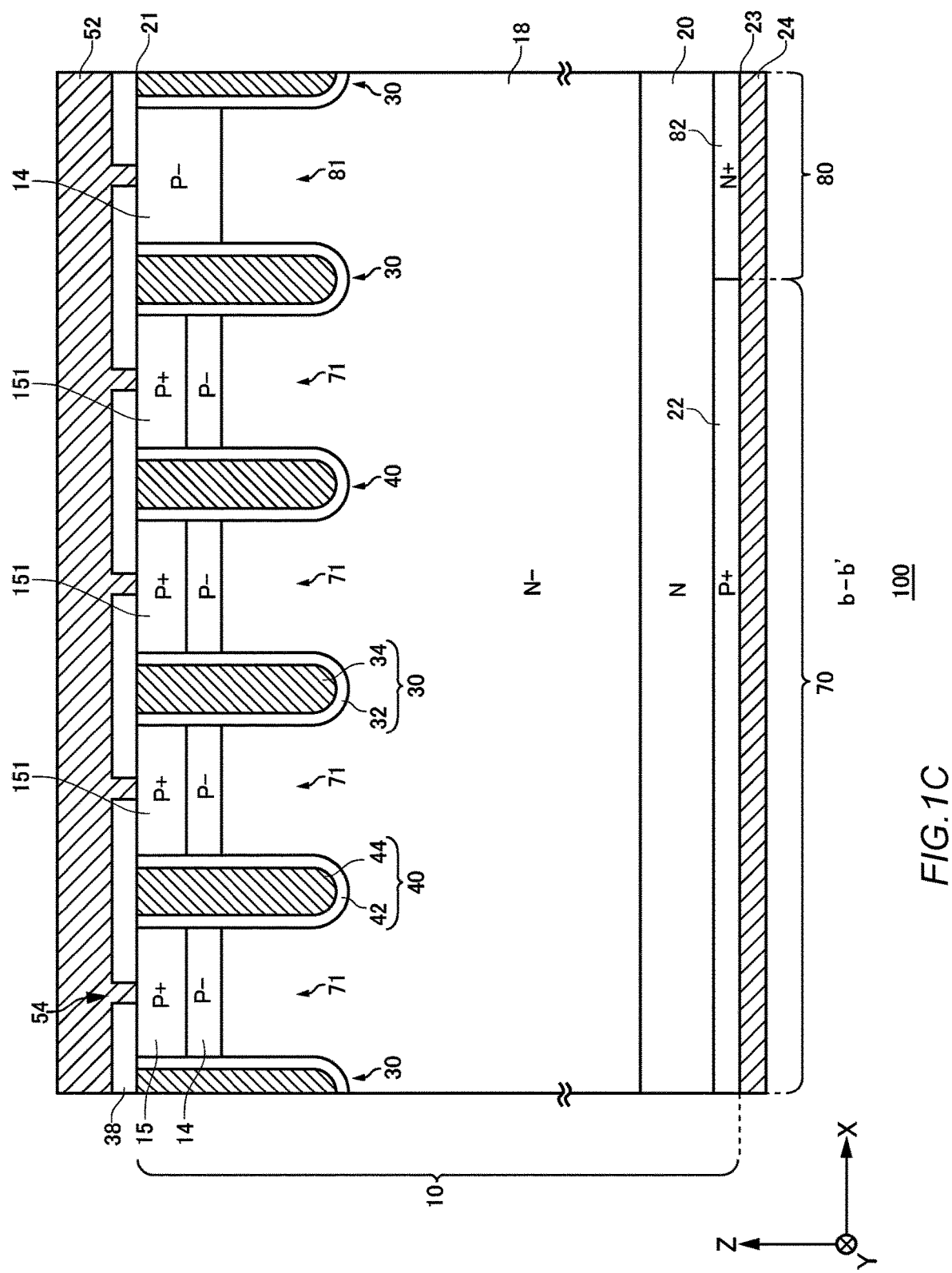
FIG. 1C shows an example of a b-b' cross sectional view in FIG. 1A.

FIG. 1C shows an example of a b-b' cross sectional view in FIG. 1A. The b-b' cross section is an X-Z plane that passes through the first contact portions 151 without passing through the emitter regions 12 in the transistor portion 70. In the present example, the mesa portion 71 in the transistor portion 70 includes the base region 14 and the first contact portion 151 above the drift region 18. In the diode portion 80, the mesa portion 81 may have a structure similar to that of the example shown in FIG. 1B.

On the front surface 21 of the semiconductor substrate 10, the first contact portion 151 is provided to extend from the gate trench portion 40 to the dummy trench portion 30 which is the first trench portion. The contact hole 54 is provided above the first contact portion 151. Holes are extracted from the first contact portion 151 via the contact hole 54.

The lower end of the first contact portion 151 and the lower end of the second contact portion 152 in the present example are provided at the same depth in the depth direction of the semiconductor substrate 10. It is to be noted that the lower end of the first contact portion 151 and the lower end of the second contact portion 152 may be provided at different depths in the depth direction of the semiconductor substrate 10. The first contact portion 151 and the second contact portion 152 may be ion-implanted under different conditions.

Figure 1D:
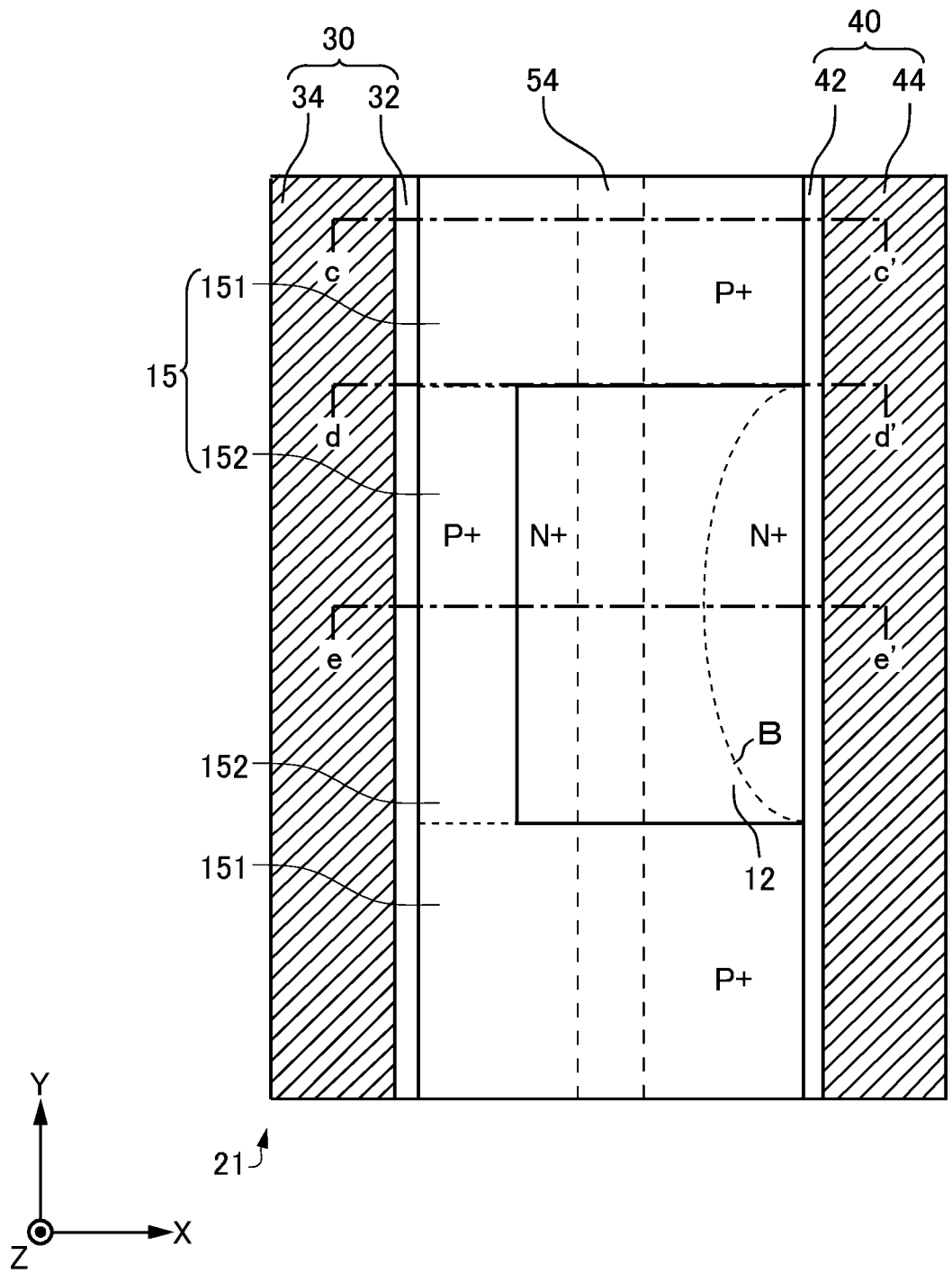
FIG. 1D shows an example of an enlarged diagram of a front surface 21 of the semiconductor device 100.

FIG. 1D shows an example of an enlarged diagram of the front surface 21 of the semiconductor device 100. The c-c' cross section shows the X-Z plane that passes through the first contact portion 151. The d-d' cross section shows the X-Z plane that passes through the second contact portion 152 in the vicinity of a boundary with the first contact portion 151. The e-e' cross section shows the X-Z plane that passes through a center portion side of the second contact portion 152 in the trench extending direction. Dashes in the emitter region 12 indicate a boundary B between the second contact portion 152 and the base region 14 below the emitter region 12.

The first contact portion 151 is provided in contact with the dummy trench portion 30 and the gate trench portion 40. The first contact portion 151 of the present example is provided in contact with the emitter region 12 and the second contact portion 152 on the front surface 21.

The second contact portion 152 is provided in contact with the dummy trench portion 30. In the mesa portion 71, the second contact portion 152 is provided to extend from the dummy trench portion 30 which is the first trench portion to below the lower end of the emitter region 12. Although the first trench portion of the present example is the dummy trench portion 30, it may be the gate trench portion 40 or the dummy gate trench portion 130. Similarly in other example embodiments, even when the first trench portion is described as the dummy trench portion 30, it may be changed as appropriate to the gate trench portion 40 or the dummy gate trench portion 130.

In the second contact portion 152, a step is provided at an end portion thereof on the gate trench portion 40 side. In the present example, the step of the second contact portion 152 is formed in an arc like the boundary B, but the shape of the boundary B is not limited to this. The boundary B may have a U shape or a V shape.

Figure 1E:
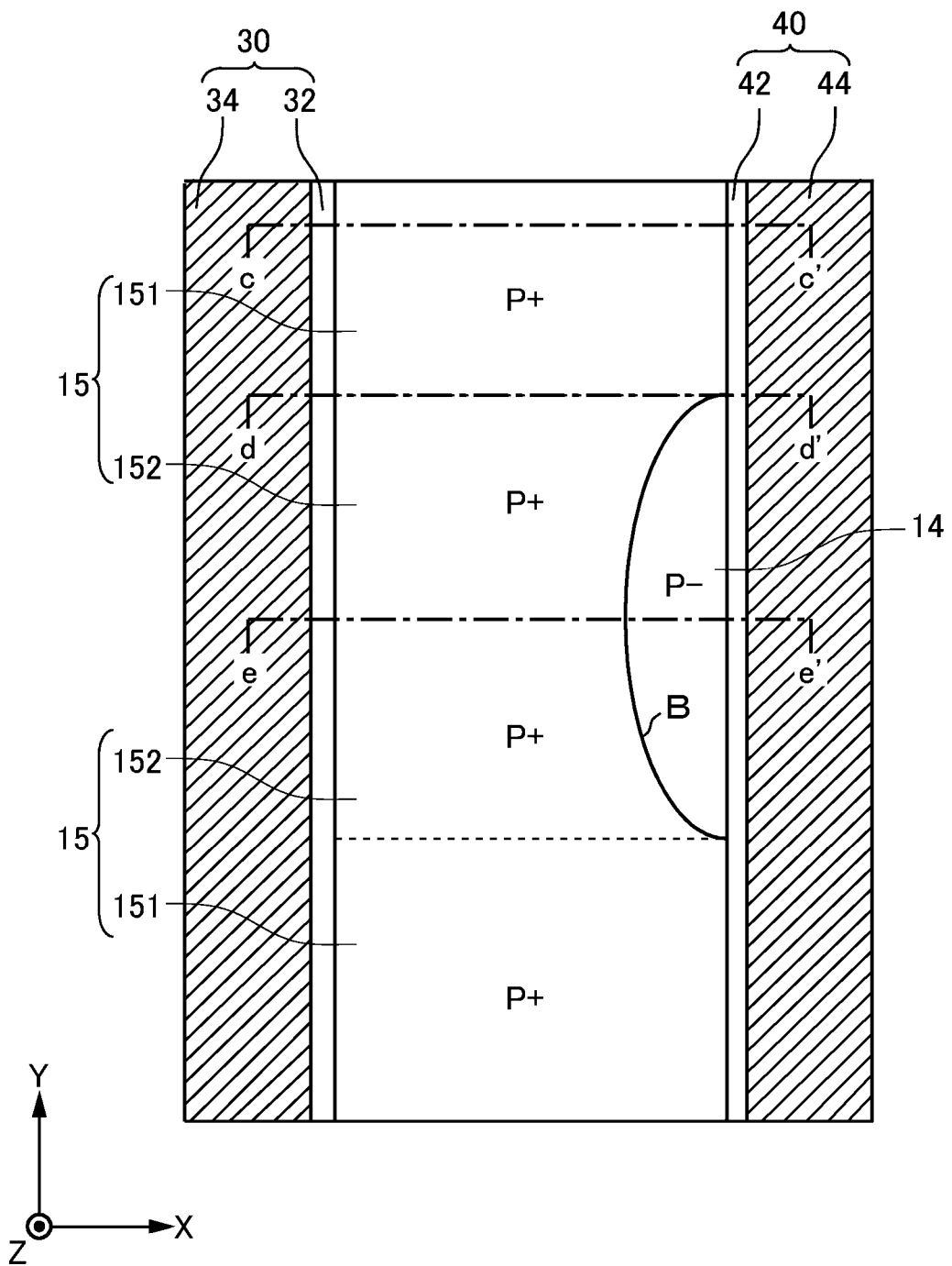
FIG. 1E shows an example of an enlarged diagram of a lower end of an emitter region 12.

FIG. 1E shows an example of an enlarged diagram at the lower end of the emitter region 12. The present figure corresponds to an X-Y plane at a deeper position than the X-Y plane shown in FIG. 1D.

Below the emitter region 12, the second contact portion 152 is in contact with the base region 14 in an arc at the boundary B. Below the emitter region 12, the base region 14 is provided in contact with the second contact portion 152. The base region 14 may be provided in contact with the first contact portion 151. The base region 14 may be in contact with the lower end of the emitter region 12.

Figure 1F:
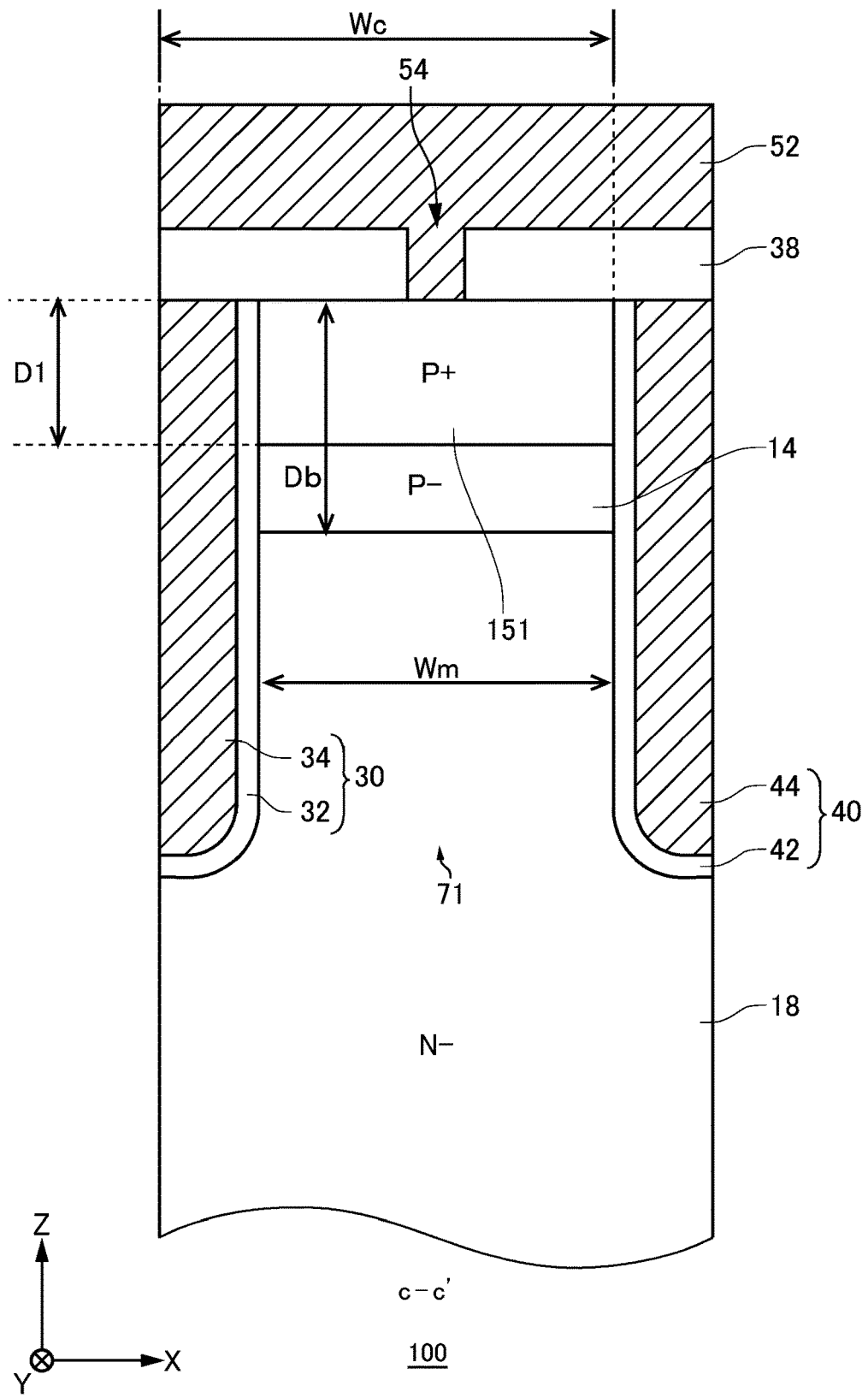
FIG. 1F shows an example of a c-c' cross sectional view in FIG. 1D.

FIG. 1F shows an example of a c-c' cross sectional view in FIG. 1D. The c-c' cross section is the X-Z plane that passes through the first contact portion 151 in the transistor portion 70. The first contact portion 151 extends beyond the contact hole 54 from the gate trench portion 40 to the dummy trench portion 30 in the trench array direction.

A thickness D1 is a thickness of the first contact portion 151 in the depth direction of the semiconductor substrate 10. The thickness D1 is smaller than a depth Db of the base region 14. For example, the thickness D1 is 0.5 µm or more and 2.0 µm or less.

A width Wc is a width measured from the center of the dummy trench portion 30 to the end portion of the contact region 15 on the gate trench portion 40 side. The width Wc of the present example corresponds to a maximum reaching position of the first contact portion 151 on the gate trench portion 40 side, which is measured from the center of the dummy trench portion 30. The width Wc may be 0.5 µm or more and 1.2 µm or less, or may be 0.7 µm or more and 1.1 µm or less.

The mesa width Wm is an interval between adjacent trench portions in the trench array direction. That is, the mesa width Wm may be a width of the mesa portion 71 in the trench array direction. The mesa width Wm may be 0.4 µm or more and 1.0 µm or less, or may be 0.5 µm or more and 0.8 µm or less.

Figure 1G:
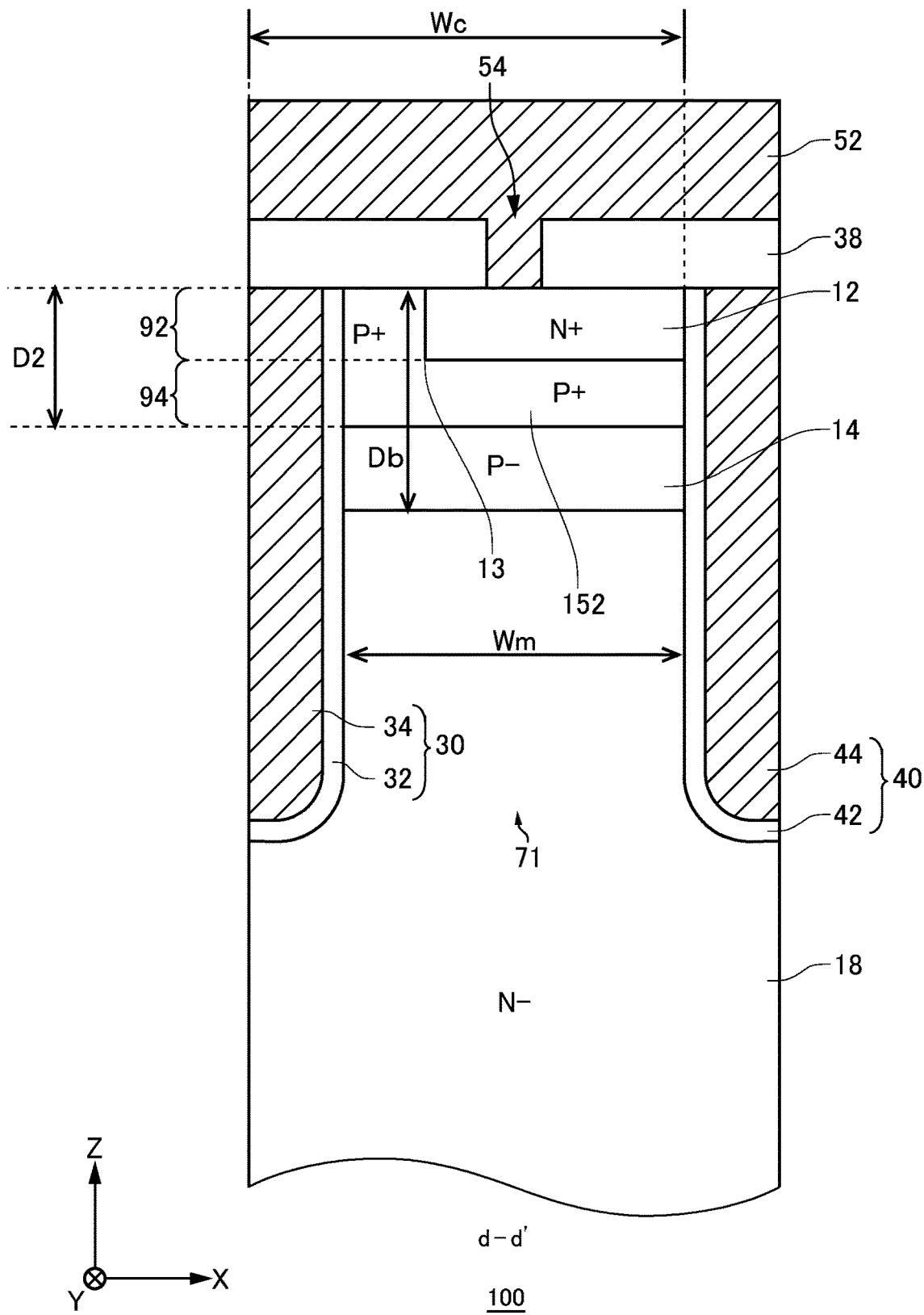
FIG. 1G shows an example of a d-d' cross sectional view in FIG. 1D.

FIG. 1G shows an example of a d-d' cross sectional view in FIG. 1D. The d-d' cross section is the X-Z plane that passes through the second contact portion 152 in the transistor portion 70.

The emitter region 12 extends beyond the contact hole 54 from the gate trench portion 40 to the dummy trench portion 30 side in the trench array direction. Accordingly, a current is easily caused to flow from the emitter region 12 through the contact hole 54. The emitter region 12 of the present example extends from the gate trench portion 40 to the dummy trench portion 30 side in the trench array direction, and is terminated before reaching the dummy trench portion 30. However, the emitter region 12 may be provided to extend from the gate trench portion 40 to the dummy trench portion 30 in the trench array direction.

The second contact portion 152 extends beyond the contact hole 54 from the dummy trench portion 30 which is the first trench portion in the trench array direction. The second contact portion 152 is provided on the front surface 21 of the semiconductor substrate 10, at the side wall of the dummy trench portion 30. The second contact portion 152 includes an upper region 92 and a lower region 94.

The upper region 92 is a region having the same depth as the emitter region 12 in the semiconductor substrate 10. As one example, the depth of the upper region 92 is 0.5 µm. It is to be noted that the depth of the upper region 92 is not limited to this. When the emitter region 12 extends from the gate trench portion 40 to the dummy trench portion 30 and reaches the dummy trench portion 30, the upper region 92 is not provided in a cross section in which the emitter region 12 is exposed from the front surface 21 of the semiconductor substrate 10. For example, a doping concentration of the upper region 92 is $5E19/cm^3$ or more and $2E20/cm^3$ or less.

The lower region 94 is provided in a region deeper than the emitter region 12 in the semiconductor substrate 10. The lower region 94 extends beyond the lower-end end portion 13 of the emitter region 12 from the dummy trench portion 30 to the gate trench portion 40 side. That is, the lower region 94 of the present example is in contact with both the dummy trench portion 30 and the gate trench portion 40. For example, a doping concentration of the lower region 94 is $1E19/cm^3$ or more and $1E20/cm^3$ or less.

The second contact portion 152 is in contact with the lower end of the emitter region 12. That is, an upper end of the lower region 94 is in contact with the lower end of the emitter region 12. The second contact portion 152 is also in contact with the lower-end end portion 13.

Herein, the width of the upper region 92 in the trench array direction may be within a range of 15% or more and 40% or less of the mesa width Wm. The width of the lower region 94 in the trench array direction may be within a range of 30% or more and 70% or less of the mesa width Wm. Further, a width of a portion where the lower region 94 overlaps with the emitter region 12 in the trench array direction may be within a range of larger than 0% and 30% or less of the mesa width Wm, or, further preferably, may be within a range of 10% or more and 20% or less of the mesa width Wm.

A thickness D2 is a thickness of the second contact portion 152 in the depth direction of the semiconductor substrate 10. The thickness D2 is larger than the depth of the lower end of the emitter region 12 and smaller than the depth Db of the base region 14. For example, the thickness D2 is 0.5 µm or more and 2.0 µm or less. The thickness of the upper region 92 may be within a range of 0.3 µm or more and 0.8 µm or less. In addition, the thickness of the lower region 94 may be within a range of 0.3 µm or more and 1.1 µm or less.

Figure 1H:
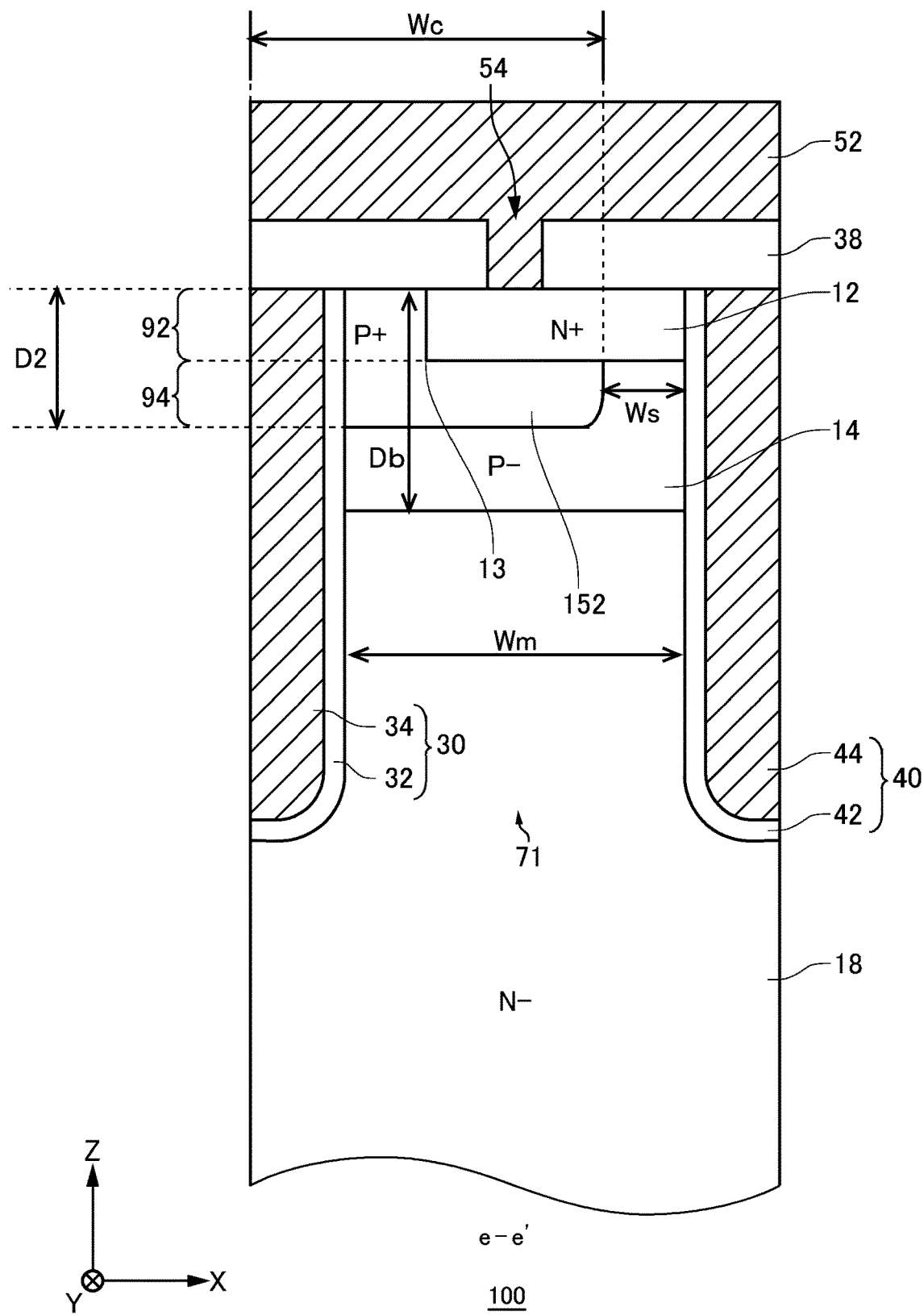
FIG. 1H shows an example of an e-e' cross sectional view in FIG. 1D.

FIG. 1H shows an example of an e-e' cross sectional view in FIG. 1D. The e-e' cross section is the X-Z plane that passes through the second contact portion 152 in the transistor portion 70. The present example differs from the d-d' cross section shown in FIG. 1G in that the lower region 94 is set apart from the gate trench portion 40. In the present example, points different from those of the example embodiment shown in FIG. 1G will be described in particular, and other points may be the same as those of the example embodiment shown in FIG. 1G.

The lower region 94 extends beyond the lower-end end portion 13 of the emitter region 12 from the dummy trench portion 30 to the gate trench portion 40 side in the trench array direction. The lower region 94 of the present example extends beyond the contact hole 54 and is terminated before reaching the gate trench portion 40 in the trench array direction.

The width Ws is a distance by which the second contact portion 152 and the gate trench portion 40 are set apart from each other in the trench array direction. The width Ws may be provided so as to enable a channel to be formed at an end portion of the gate trench portion 40. In one example, the width Ws is 0.6 μm or more. The width Ws may be 1.6 μm or less. The width Ws may be within a range of 10% or more and 50% or less of the mesa width Wm.

A size of the step of the second contact portion 152 on the gate trench portion 40 side may be 10% or more and 50% or less of the mesa width Wm of the mesa portion 71. As in the present example, when a part of the second contact portion 152 is in contact with the gate trench portion 40, the size of the step of the second contact portion 152 in the trench array direction becomes equal to the width Ws.

Figure 2:
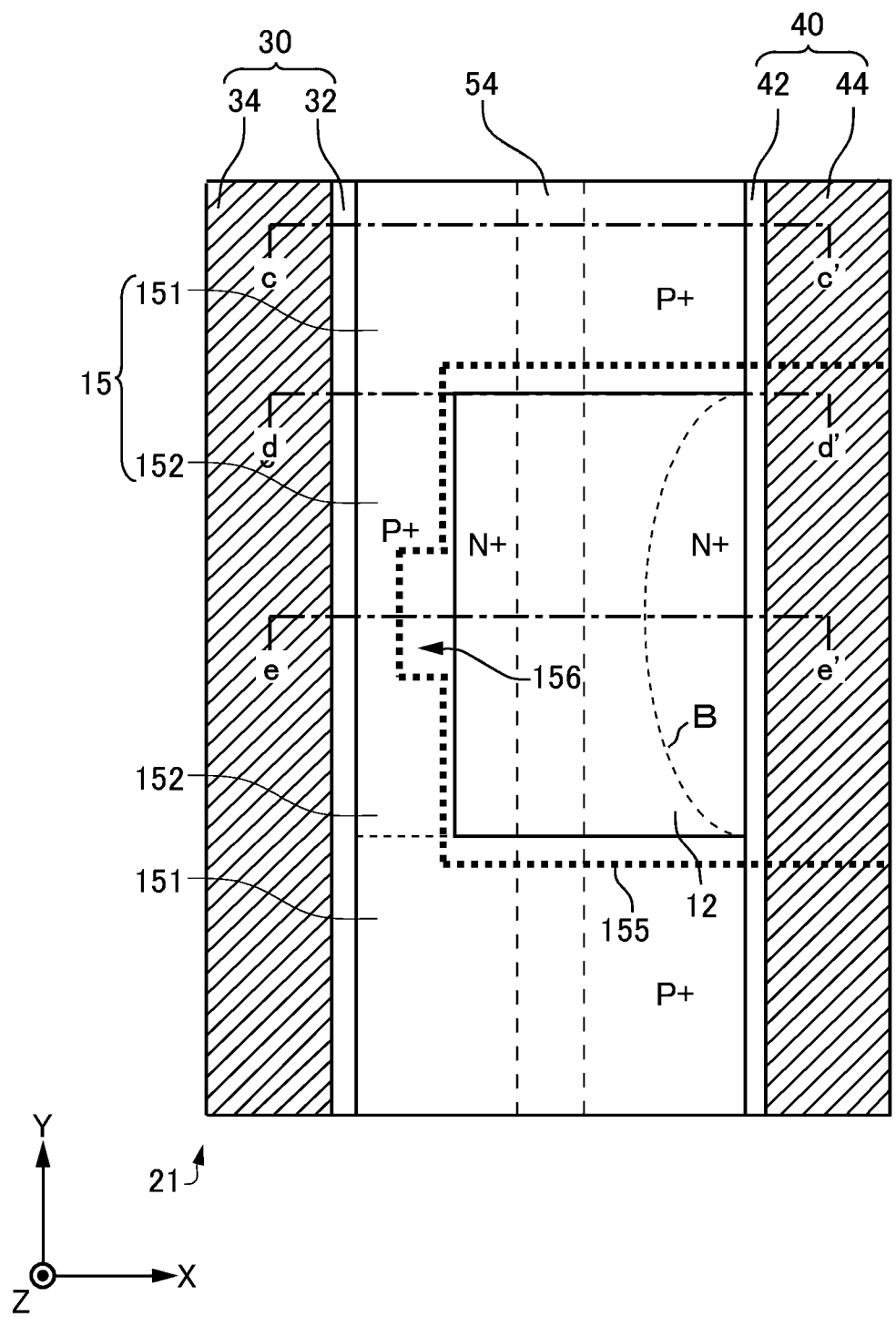
FIG. 2 is a diagram for describing an example of a manufacturing method of the semiconductor device 100.

FIG. 2 is a diagram for describing an example of a manufacturing method of the semiconductor device 100. In the present figure, a mask 155 for forming the contact region 15 is indicated by dashes in the enlarged diagram of the front surface 21 of the semiconductor device 100 shown in FIG. 1D. The mask 155 includes a thinning region 156.

The thinning region 156 is a region that is recessed toward an inner side of the mask 155 at a center portion of the emitter region 12 in the trench extending direction. By providing the thinning region 156, when diffusing the dopant by annealing after the ion implantation, a step can be formed in the second contact portion 152 on the gate trench portion 40 side. The size of the thinning region 156 may be determined according to the mesa width Wm, a diffusion distance of the second contact portion 152, and the like.

Figure 3:
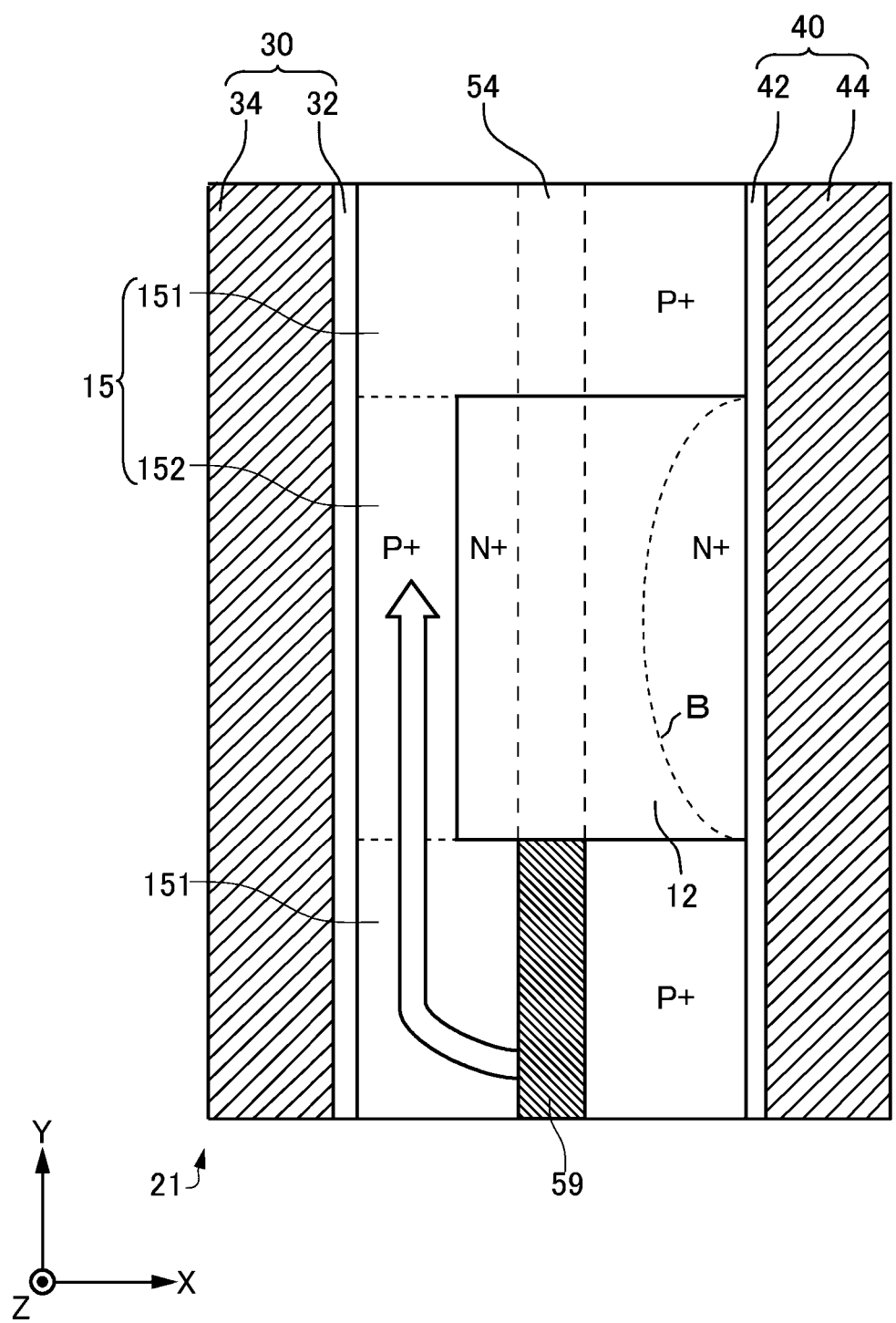
FIG. 3 shows an example of a top view of the semiconductor device 100 including a disconnected region 59.

FIG. 3 shows an example of a top view of the semiconductor device 100 including a disconnected region 59. The disconnected region 59 of the present example is a region where the contact hole 54 is not formed, though the present invention is not limited to this.

The disconnected region 59 is a region where the emitter electrode 52 and the semiconductor substrate 10 are not connected. The disconnected region 59 of the present example is a region where the contact hole 54 is not formed and where the emitter electrode 52 is not electrically connected with the first contact portion 151 on the front surface 21. For example, the disconnected region 59 is an unopened region where the contact hole 54 is not formed in the interlayer dielectric film 38 due to oxide film etching defects or the like caused by particles, foreign matters, or the like. Alternatively, the disconnected region 59 may be a region where the first contact portion 151 is not formed on the front surface 21 due to residual resist or the like.

In the present example, the hole current that would have been extracted in the disconnected region 59 flows through the contact region 15 and is extracted via the contact holes 54 above the other neighboring contact regions 15. That is, the hole current does not flow through the base region 14 below the emitter region 12, but flows through the contact region 15, which has a lower resistance to holes than the base region 14, and thus latch-up can be suppressed. Accordingly, switching breakdowns caused by process defects are suppressed. Therefore, a semiconductor device 100 including an element structure that is strong to process defects and has redundancy can be provided.

Further, since holes can be extracted via the second contact portion 152 provided below the emitter region 12 in the semiconductor device 100 of the present example, it becomes easier to suppress latch-up. Since the semiconductor device 100 of the present example includes the second contact portion 152 below the emitter region 12, the emitter region 12 may be extended to the dummy trench portion 30 which is the first trench portion.

Figure 4A:
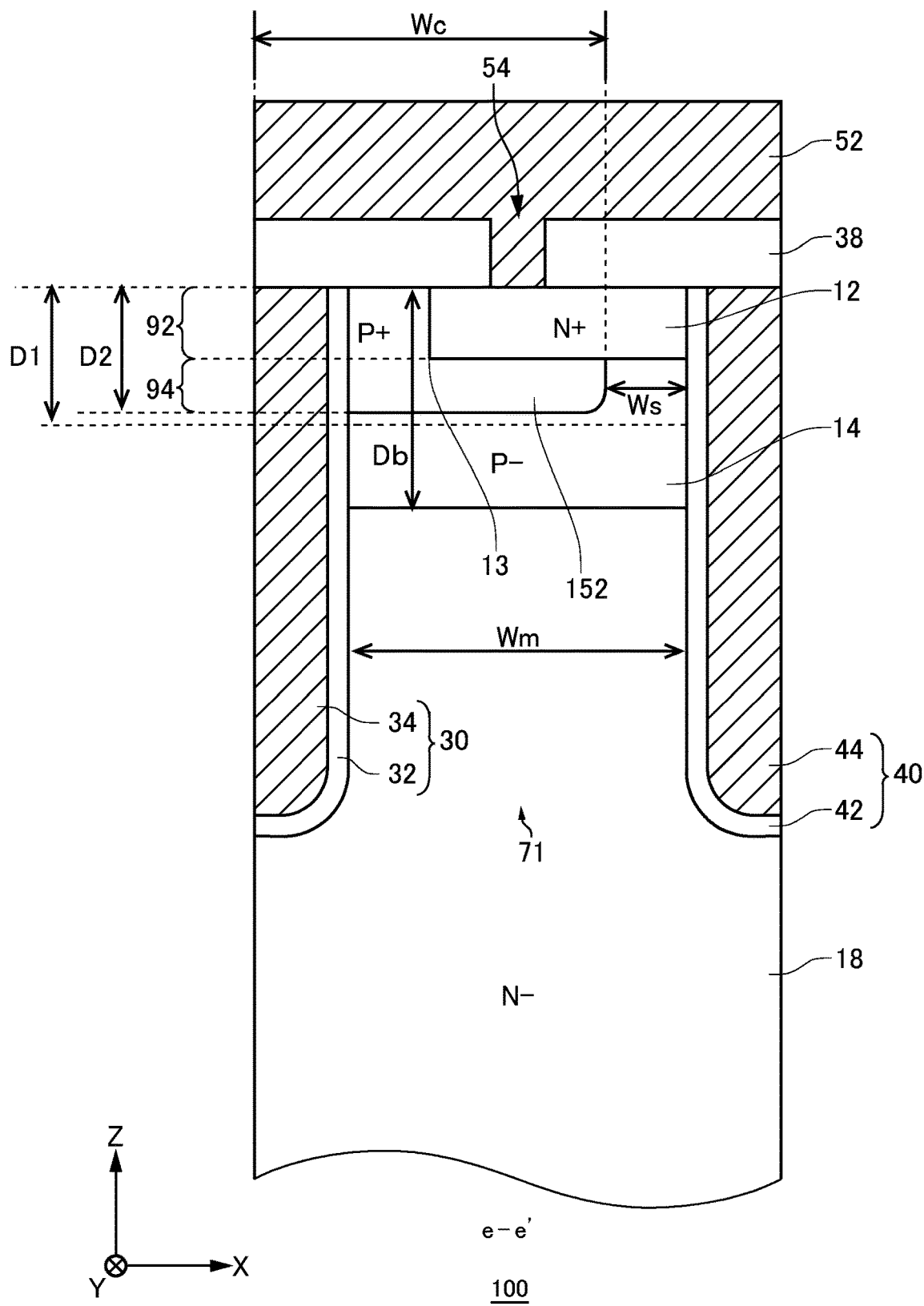
FIG. 4A is a cross sectional view showing a modification example of the semiconductor device 100.

FIG. 4A is a cross sectional view showing a modification example of the semiconductor device 100. The second contact portion 152 of the present example is formed to be shallower than the first contact portion 151. That is, the thickness D2 of the second contact portion 152 is smaller than the thickness D1 of the first contact portion 151. The lower end of the second contact portion 152 may be shallower than the lower end of the first contact portion 151 in the depth direction of the semiconductor substrate 10.

Herein, by being ion-implanted in the same region as the emitter region 12 or in the vicinity of the emitter region 12, the second contact portion 152 may sometimes be formed to be shallower than the first contact portion 151 due to the effect of the emitter region 12. Further, the second contact portion 152 may be formed to be shallower than the first contact portion 151 by adjusting the ion implantation condition. The dopant for forming the second contact portion 152 may be ion-implanted to be shallower than the dopant for forming the first contact portion 151 in the depth direction of the semiconductor substrate 10.

Figure 4B:
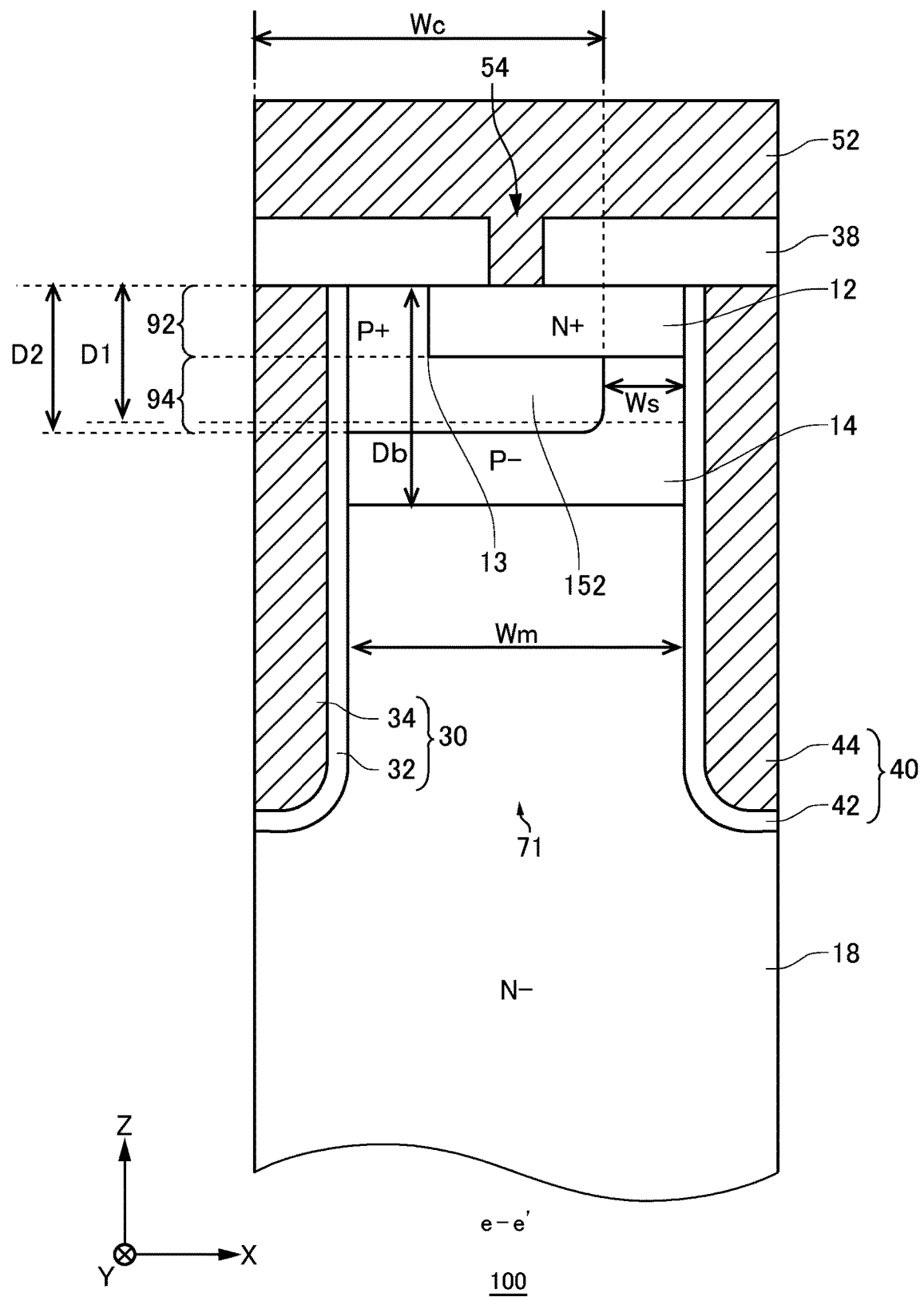
FIG. 4B is a cross sectional view showing a modification example of the semiconductor device 100.

FIG. 4B is a cross sectional view showing a modification example of the semiconductor device 100. The second contact portion 152 of the present example is formed to be deeper than the first contact portion 151. That is, the thickness D2 of the second contact portion 152 is larger than the thickness D1 of the first contact portion 151. The lower end of the second contact portion 152 may be deeper than the lower end of the first contact portion 151 in the depth direction of the semiconductor substrate 10. The dopant for forming the second contact portion 152 may be ion-implanted to be deeper than the dopant for forming the first contact portion 151 in the depth direction of the semiconductor substrate 10. By forming the second contact portion 152 to be deep, holes below the emitter region 12 can be extracted with ease. The lower end of the second contact portion 152 may be deeper than the lower end of the emitter region 12 and may be shallower than the lower end of the base region 14.

Herein, when the contact region 15 is formed to be deep, the doping concentration of the front surface 21 may be lowered to cause an increase of the contact resistance with the emitter electrode 52. In the present example, since the second contact portion 152 that is not in contact with the emitter electrode 52 is provided to be deeper than the first contact portion 151, the effect of the increase of the contact resistance is small due to the second contact portion 152 being formed deeply.

Figure 5:
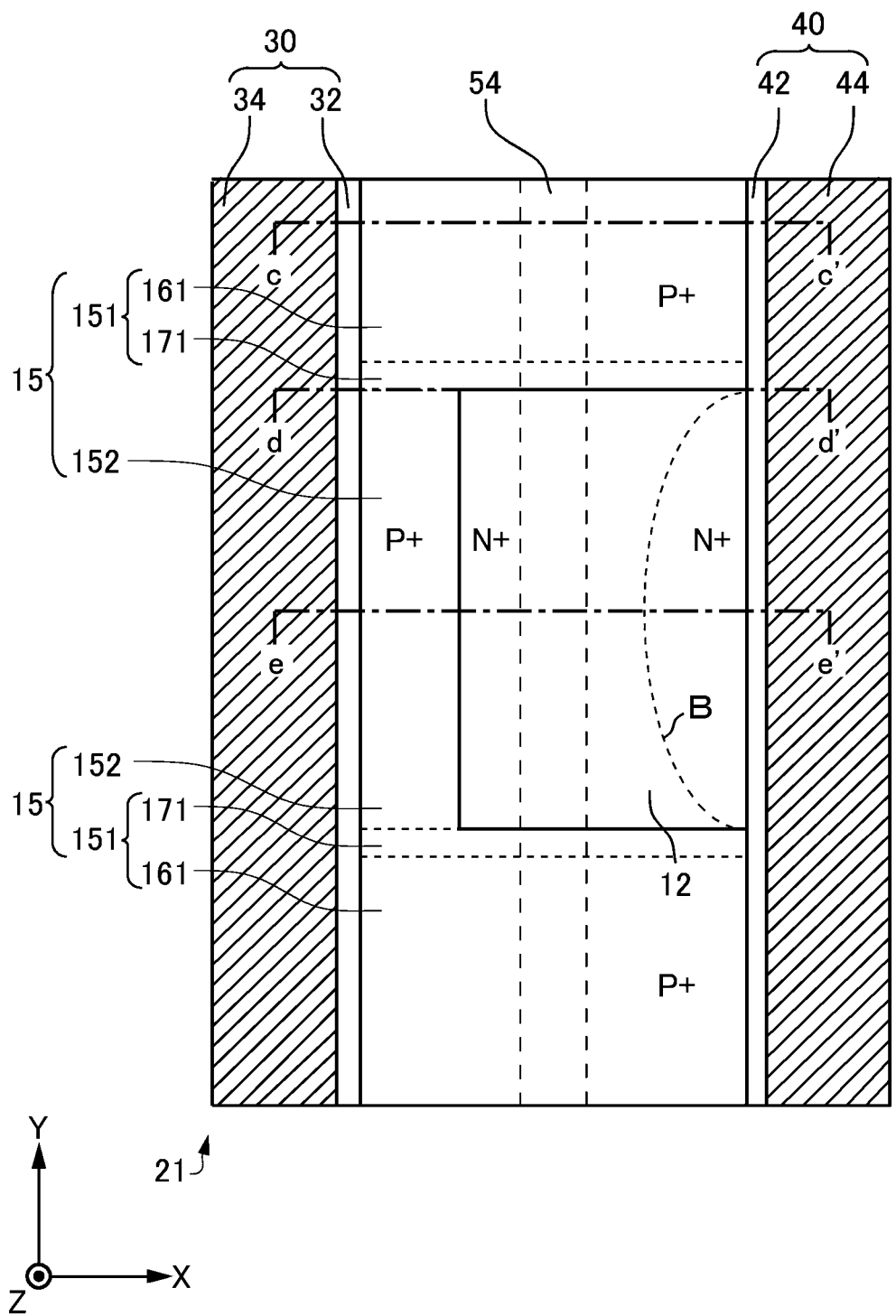
FIG. 5 shows an example of an enlarged diagram of the front surface 21 of the semiconductor device 100 according to a modification example.

FIG. 5 shows an example of an enlarged diagram of the front surface 21 of the semiconductor device 100 as a modification example. The first contact portion 151 of the present example includes low concentration regions 161 and high concentration regions 171.

The low concentration region 161 has a doping concentration and is provided to be exposed from the front surface 21 of the semiconductor substrate 10. The low concentration region 161 is provided to extend from the dummy trench portion 30 which is the first trench portion to the gate trench portion 40 in the trench array direction. The low concentration region 161 may be provided while being sandwiched between the high concentration regions 171 in the trench extending direction.

The high concentration region 171 is provided to be exposed from the front surface 21 of the semiconductor substrate 10. A doping concentration of the high concentration region 171 is higher than the doping concentration of the low concentration region 161. The doping concentration of the high concentration region 171 may be higher than the doping concentration of the second contact portion 152. On the front surface 21, the high concentration region 171 is provided between the low concentration region 161 and the second contact portion 152. In addition, on the front surface 21, the high concentration region 171 may be provided between the low concentration region 161 and the emitter region 12.

The high concentration region 171 may be formed by performing ion implantation in a state where the first contact portion 151 and the second contact portion 152 overlap each other. That is, the high concentration region 171 may be a region that is affected by both the ion implantation for forming the first contact portion 151 and the ion implantation for forming the second contact portion 152. In this case, the first contact portion 151 and the second contact portion 152 can each be formed by performing the ion implantation once. In other words, the second contact portion 152, the low concentration region 161, and the high concentration region 171 may be formed by performing the ion implantation twice. It is to be noted that the second contact portion 152, the low concentration region 161, and the high concentration region 171 may respectively be ion-implanted under different conditions.

Figure 6A:
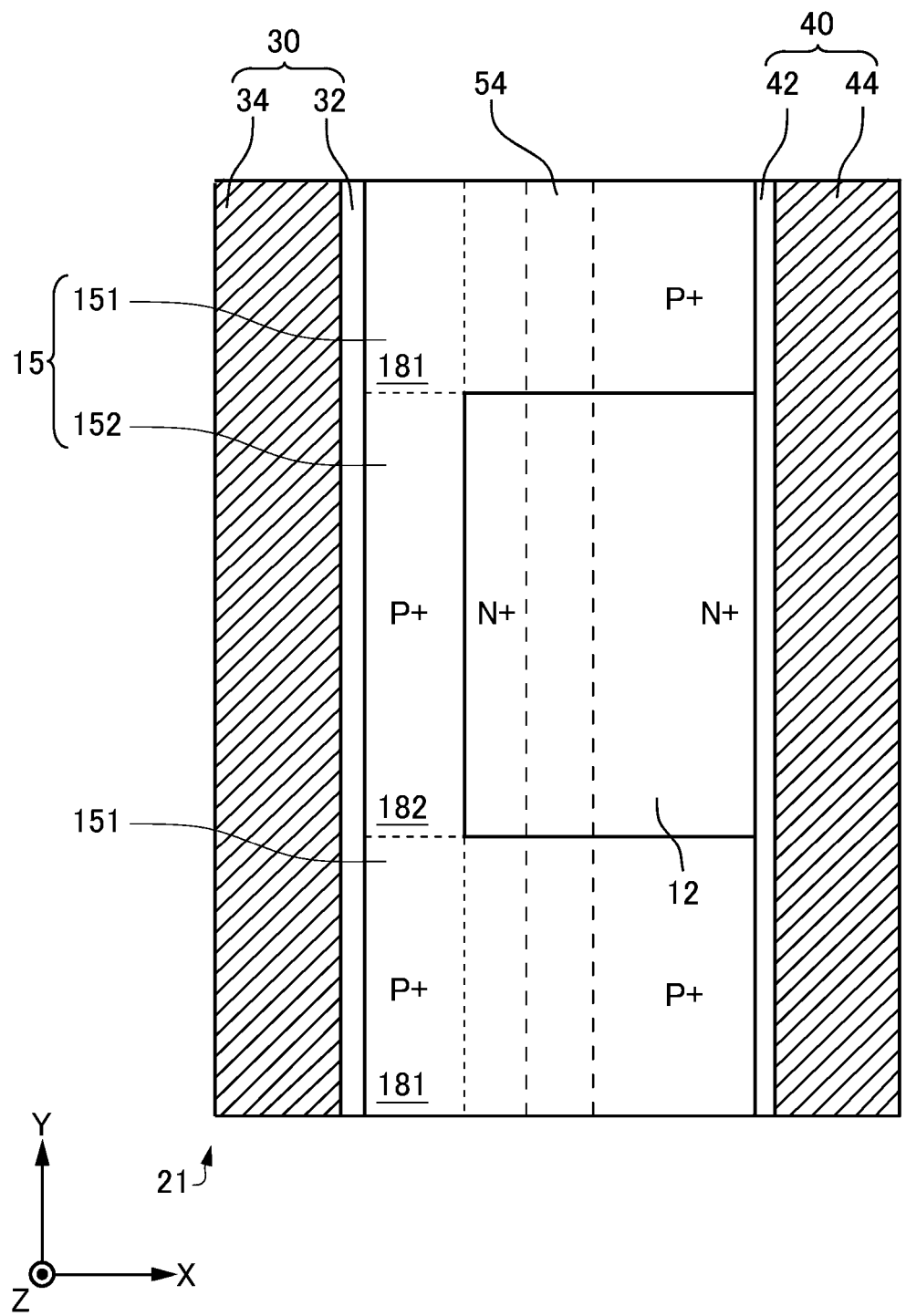
FIG. 6A shows an example of an enlarged diagram of the front surface 21 of the semiconductor device 100 according to a modification example.

FIG. 6A shows an example of an enlarged diagram of the front surface 21 of the semiconductor device 100 as a modification example. In the present example, the first contact portion 151 includes a high concentration region 181, and the second contact portion 152 includes a low concentration region 182.

The high concentration region 181 is provided to be exposed from the front surface 21 of the semiconductor substrate 10. A doping concentration of the high concentration region 181 is higher than a doping concentration of the low concentration region 182. On the front surface 21, the high concentration region 181 is provided on the side wall of the dummy trench portion 30 which is the first trench portion. The high concentration region 181 is provided to extend from the dummy trench portion 30 which is the first trench portion toward the gate trench portion 40 in the trench array direction. An end portion of the high concentration region 181 in the trench array direction may be positioned between the dummy trench portion 30 and the contact hole 54. The end portion of the high concentration region 181 in the trench array direction may be at the same position as an end portion of the low concentration region 182 in the trench array direction.

The low concentration region 182 is provided to be exposed from the front surface 21 of the semiconductor substrate 10. On the front surface 21, the low concentration region 182 is provided on the side wall of the dummy trench portion 30 which is the first trench portion. The low concentration region 182 may be provided from the dummy trench portion 30 to the end portion of the emitter region 12 in the trench array direction. The low concentration region 182 may be provided below the emitter region 12, or does not need to be provided.

The high concentration region 181 may be a region where both the dopant for forming the first contact portion 151 and the dopant for forming the second contact portion 152 are ion-implanted. Accordingly, the high concentration region 181 may have a higher doping concentration than other regions of the first contact portion 151.

Figure 6B:
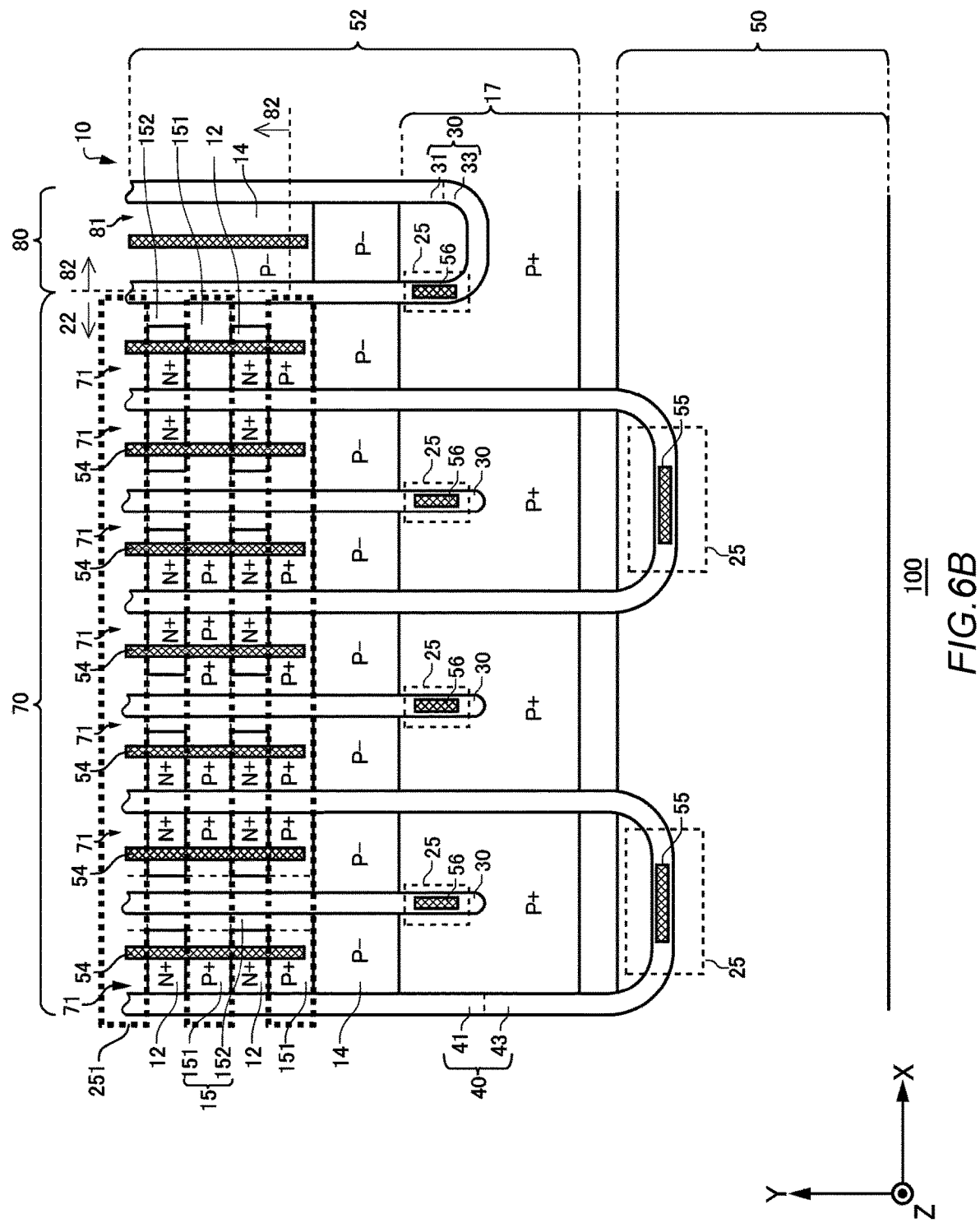
FIG. 6B shows an example of a top view of the semiconductor device 100, that shows a first ion implantation region 251 for forming a first contact portion 151.

FIG. 6B is an example of a top view of the semiconductor device 100, which shows first ion implantation regions 251 for forming the first contact portions 151.

The first ion implantation region 251 is a region where the dopant for forming the first contact portion 151 is ion-implanted. In a top view, the first ion implantation region 251 extends in the trench array direction. The first ion implantation region 251 of the present example crosses the regions where the trench portions are to be formed and extends in the trench array direction. The first ion implantation regions 251 of the present example are provided in regions other than the regions where the emitter regions 12 are to be formed. It is to be noted that a part of the first ion implantation regions 251 may overlap with the regions where the emitter regions 12 are to be formed. The first ion implantation region 251 may be provided in the transistor portion 70 and not be provided in the diode portion 80.

Figure 6C:
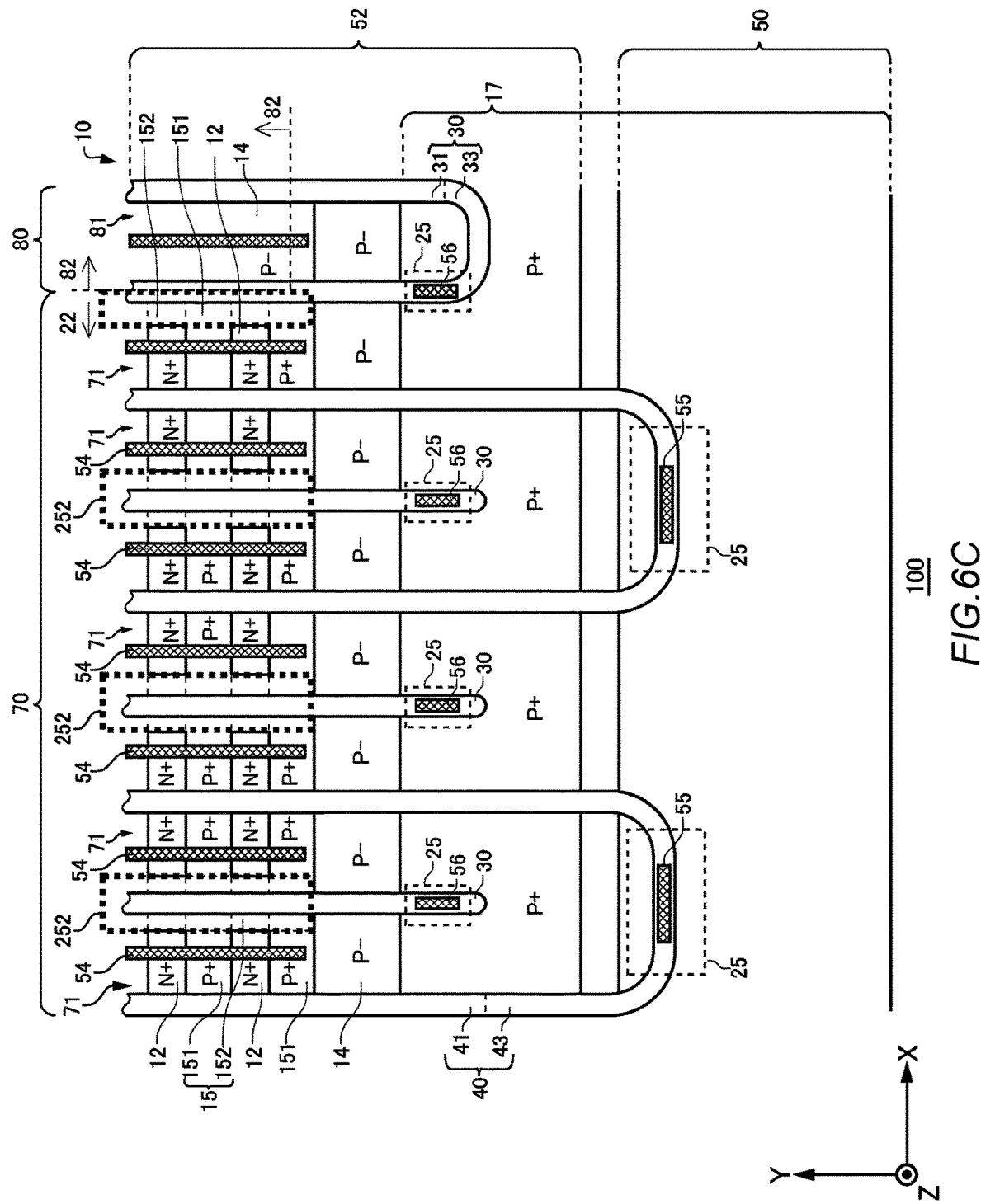
FIG. 6C shows an example of a top view of the semiconductor device 100, that shows a second ion implantation region 252 for forming a second contact portion 152.

FIG. 6C is an example of a top view of the semiconductor device 100, which shows second ion implantation regions 252 for forming the second contact portions 152.

The second ion implantation region 252 is a region where the dopant for forming the second contact portion 152 is ion-implanted. The second ion implantation region 252 extends in the trench extending direction. The second ion implantation region 252 may overlap with the region where the dummy trench portion 30 which is the first trench portion is to be formed. The second ion implantation region 252 of the present example includes the dummy trench portion 30 which is the first trench portion and the mesa portions 71 at both ends of the dummy trench portion 30. In a top view, the second ion implantation region 252 may overlap with the first ion implantation region 251. It is to be noted that the second ion implantation regions 252 may be arranged selectively in accordance with the regions where the second contact portions 152 are to be formed without extending in the trench extending direction.

The second ion implantation regions 252 of the present example are provided in regions other than the regions where the emitter regions 12 are to be formed. It is to be noted that a part of the second ion implantation regions 252 may overlap with the regions where the emitter regions 12 are to be formed. The second ion implantation region 252 may be provided in the transistor portion 70 and not be provided in the diode portion 80.

Figure 6D:
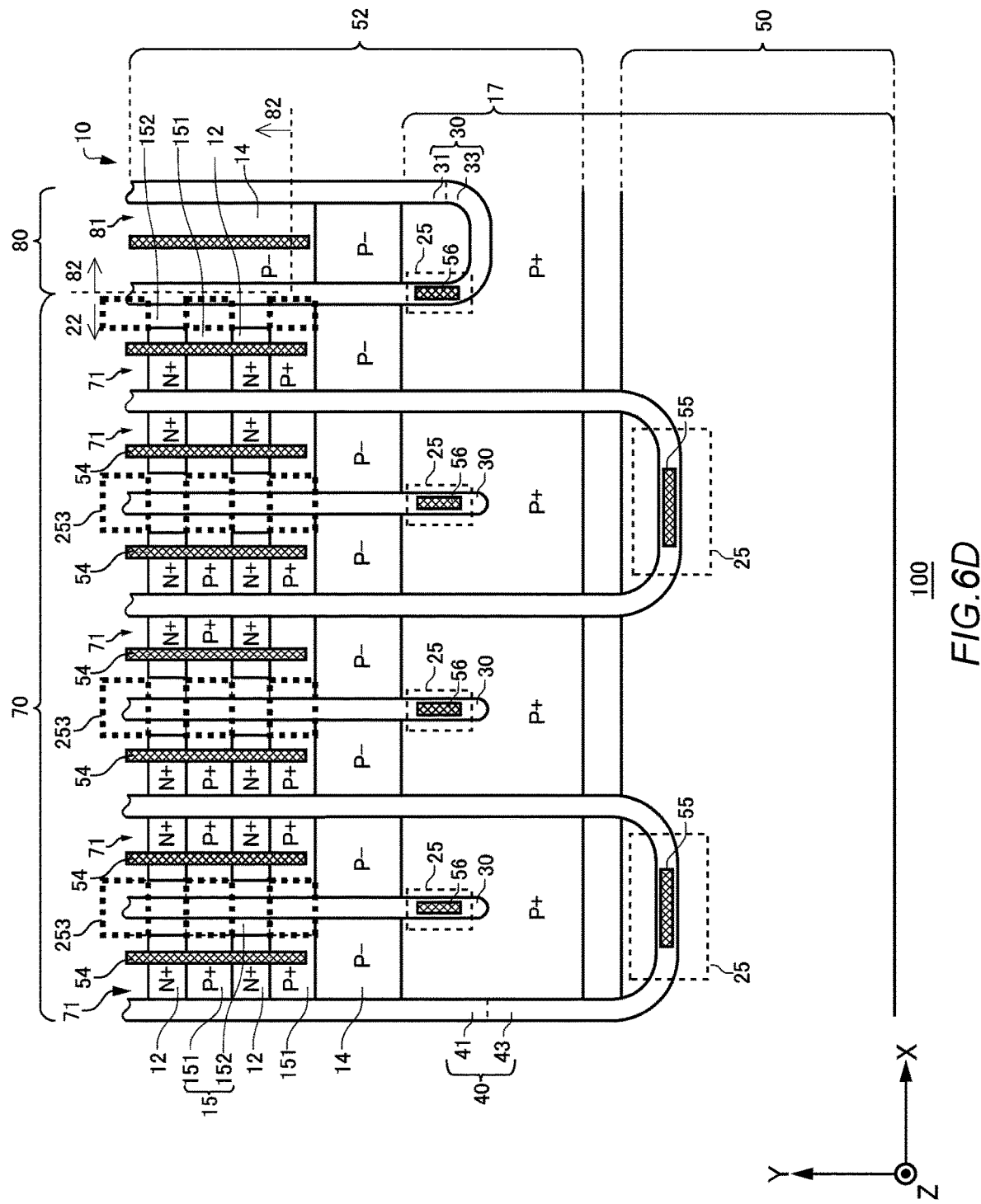
FIG. 6D shows an example of a top view of the semiconductor device 100, that shows an overlapping ion implantation region 253.

FIG. 6D is an example of a top view of the semiconductor device 100, which shows overlapping ion implantation regions 253. In the present example, the dopant for forming the first contact portion 151 may be ion-implanted such that at least a part of the dopant overlaps with the dopant for forming the second contact portion 152.

The overlapping ion implantation regions 253 are regions where the first ion implantation regions 251 shown in FIG. 6B and the second ion implantation regions 252 shown in FIG. 6C overlap in a top view. The overlapping ion implantation region 253 is provided to extend beyond the dummy trench portion 30 from the mesa portion 71 in contact with the side wall of the dummy trench portion 30 as the first trench portion to another adjacent mesa portion 71. The overlapping ion implantation region 253 of the mesa portion 71 corresponds to the region where the high concentration region 181 of the first contact portion 151 is to be formed. As described above, in the semiconductor device 100 of the present example, the high concentration region 181 of the first contact portion 151 can be formed by performing the ion implantation twice for forming the first contact portion 151 and the second contact portion 152. As described above, on the side wall of the dummy trench portion 30 which is the first trench portion, the second contact portions 152 that are provided alternately with the first contact portions 151 in the trench extending direction can be formed. It is to be noted that the shape of the mask for forming the first contact portion 151 and the second contact portion 152 is not limited to the present example.

Figure 7A:
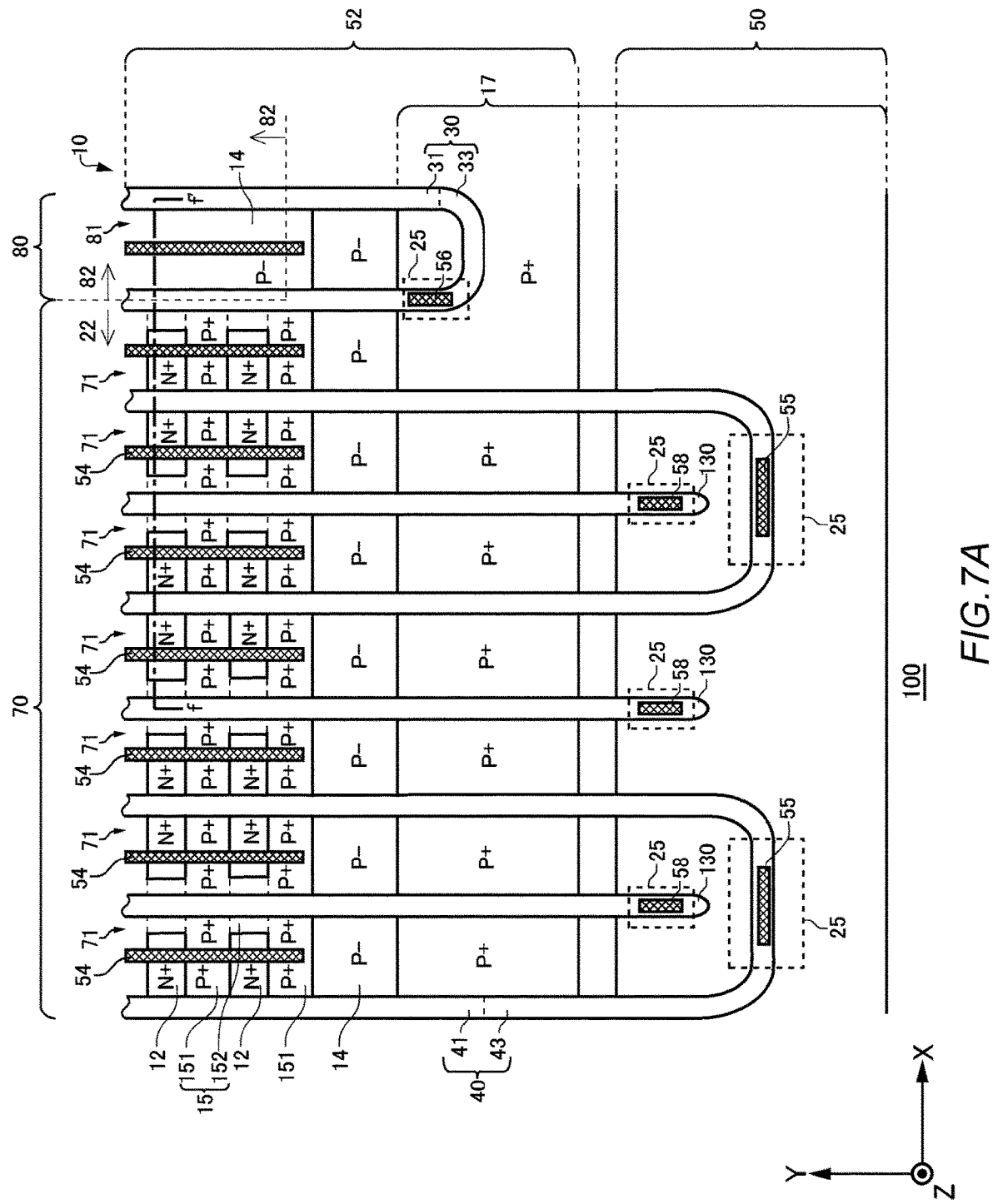
FIG. 7A shows an example of a top view of the semiconductor device 100 according to a modification example.

FIG. 7A shows an example of a top view of the semiconductor device 100 as a modification example. In the present example, points different from those of FIG. 1A will be described in particular. The semiconductor device 100 of the present example includes, as the first trench portion, the dummy gate trench portion 130 that is not in contact with the emitter region 12.

The dummy gate trench portion 130 is a trench portion that is not in contact with the emitter region 12 and set at the gate potential. That is, since it is not in contact with the emitter region 12 in the vicinity of the side wall of the dummy gate trench portion 130, a channel due to an inversion layer of the first conductivity type is not formed. The dummy gate trench portion 130 extends to the region where the gate metal layer 50 is provided in the Y axis direction. The dummy gate trench portion 130 is connected to the gate metal layer 50 via a contact hole 58 and is set at the gate potential.

Since the dummy gate trench portion 130 is apt to draw carriers to the mesa portion 71, a property such as a gate capacitance differs from that of the dummy trench portion 30. Therefore, by using the dummy gate trench portion 130 and the dummy trench portion 30 in combination, a threshold voltage, a saturation current, an electric field strength, a gate capacitance, and the like in the semiconductor device 100 can be adjusted.

On the front surface 21 of the semiconductor substrate 10, the gate trench portion 40 of the present example has a U-shaped structure, and the dummy gate trench portion 130 has an I-shaped structure. However, the structures of the gate trench portion 40 and the dummy gate trench portion 130 are not limited to these structures as long as a desired array ratio can be achieved.

In the present example, the structure of the dummy trench portion 30 in the diode portion 80 is similar to the structure shown in FIG. 1A. That is, the dummy trench portion 30 is connected to the emitter electrode 52 via the contact hole 56 and is set at the emitter potential.

Figure 7B:
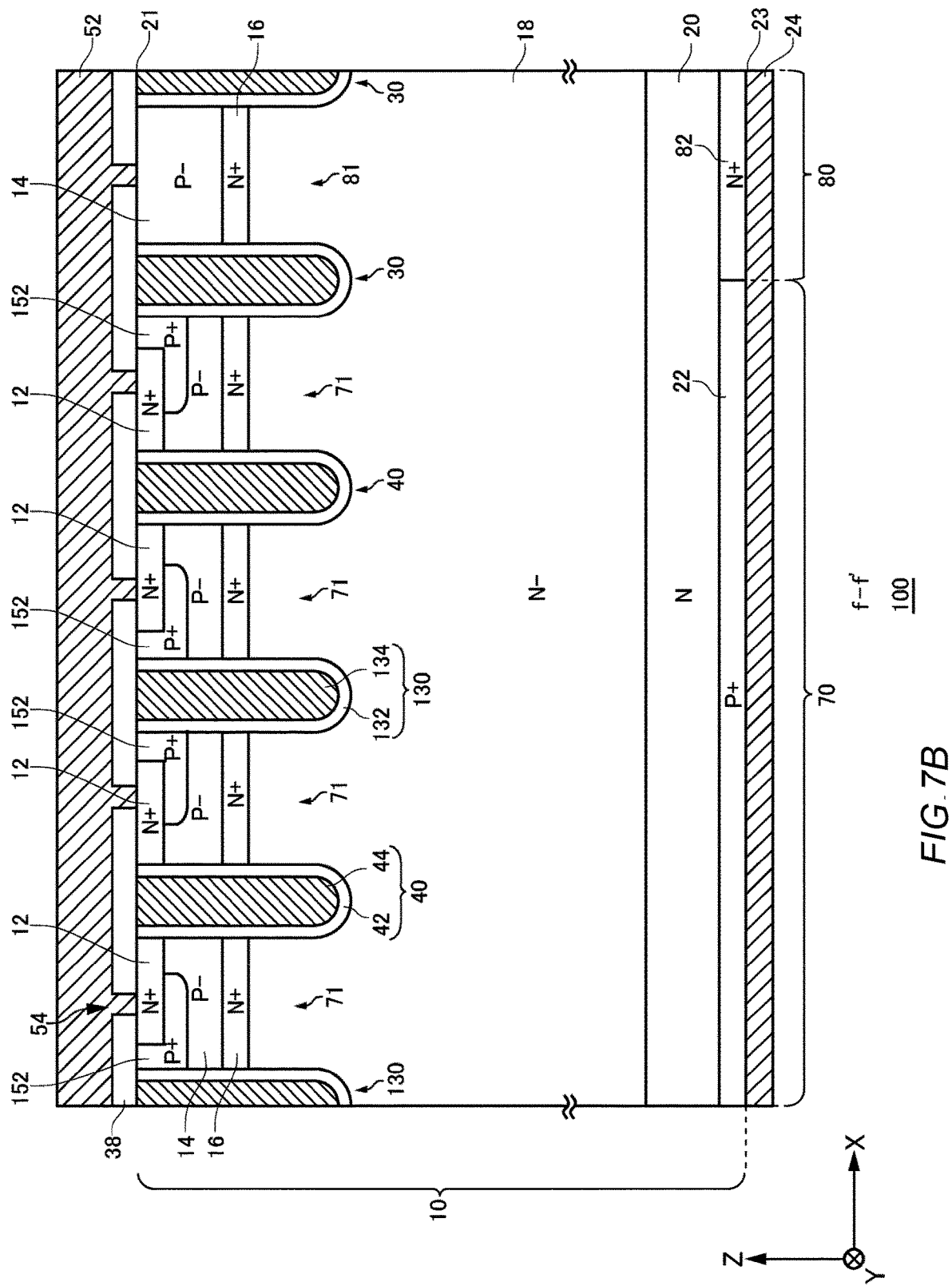
FIG. 7B shows an example of an f-f' cross sectional view in FIG. 7A.

FIG. 7B shows an example of an f-f' cross sectional view in FIG. 7A. The f-f' cross section is the X-Z plane that passes through the emitter regions 12 in the transistor portion 70 and passes through the base region 14 in the diode portion 80. The dummy gate trench portion 130 has a second gate dielectric film 132 and a second gate conductive portion 134. The semiconductor device 100 of the present example includes accumulation regions 16.

The accumulation region 16 is a region of the first conductivity type, that is provided between the base region 14 and the drift region 18. The accumulation region 16 of the present example is of N+ type, by way of example. The accumulation region 16 is provided in the transistor portion 70 and the diode portion 80. Accordingly, the semiconductor device 100 can avoid mask misalignment in the accumulation region 16. The accumulation regions 16 are provided in contact with the gate trench portions 40. The accumulation region 16 may be in contact with the dummy trench portion 30 and the dummy gate trench portion 130, or does not need to be in contact with the dummy trench portion 30 and the dummy gate trench portion 130.

The doping concentration of the accumulation region 16 is higher than the doping concentration of the drift region 18. The dosage of ion implantation to the accumulation region 16 may be 1E12 cm$^{-2}$ or more and 1E13 cm$^{-2}$ or less. Alternatively, the dosage of ion implantation to the accumulation region 16 may be 3E12 cm$^{-2}$ or more and 6E12 cm$^{-2}$ or less. By providing the accumulation region 16, the carrier injection enhancement effect (Injection Enhancement effect) can be improved, and the ON voltage of the transistor portion 70 can be decreased.

Figure 8A:
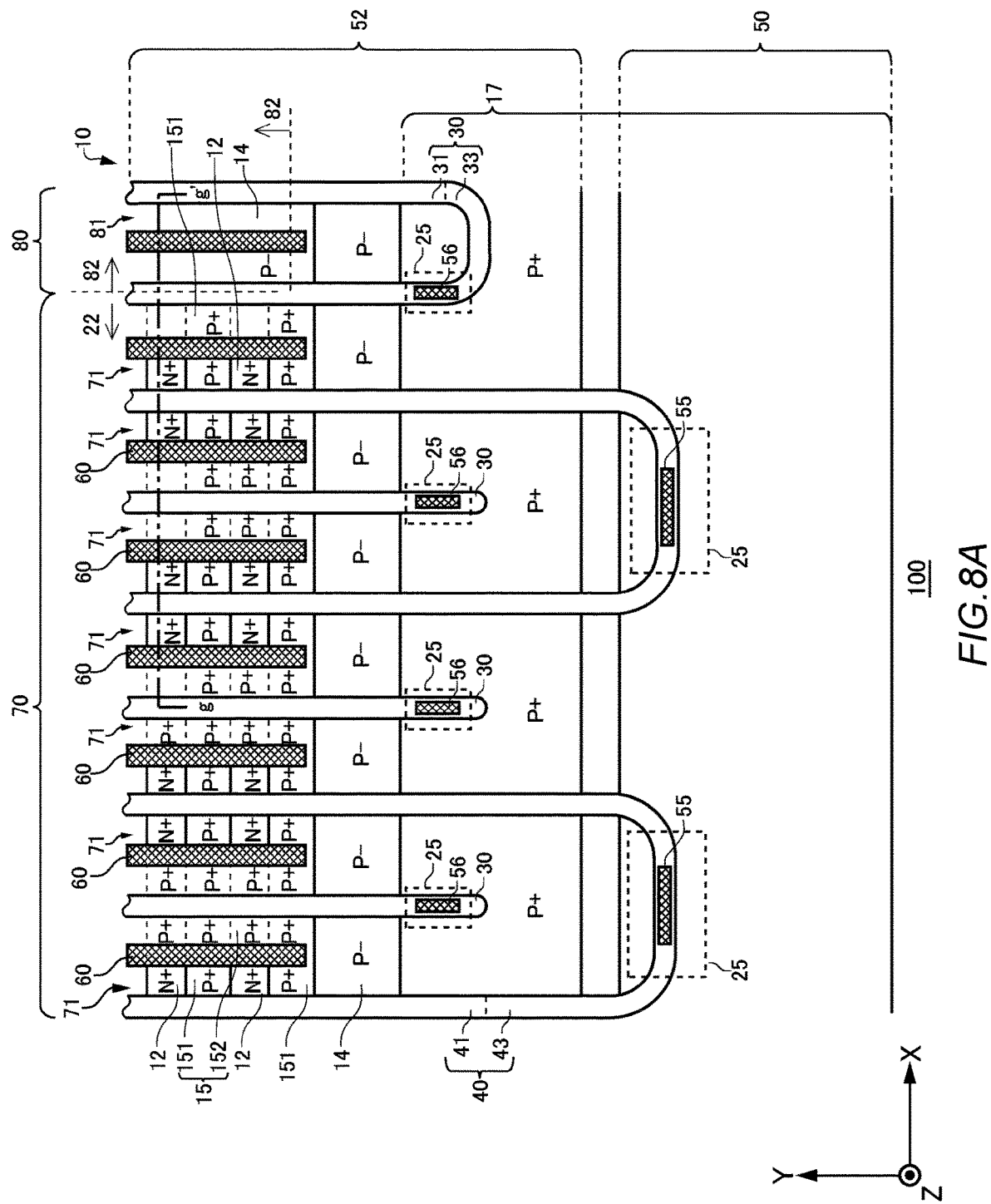
FIG. 8A shows an example of a top view of the semiconductor device 100 according to a modification example.

FIG. 8A shows an example of a top view of the semiconductor device 100 as a modification example. The semiconductor device 100 of the present example includes contact trench portions 60.

The contact trench portion 60 is provided to extend in the depth direction of the semiconductor substrate 10 from the front surface 21. The contact trench portion 60 electrically connects the emitter electrode 52 and the semiconductor substrate 10. The contact trench portion 60 is provided to extend in the trench extending direction. The contact trench portions 60 of the present example are arranged in a striped pattern along the gate trench portions 40 and the dummy trench portions 30.

The contact trench portion 60 is formed above each region of the emitter region 12 and the contact region 15 in the transistor portion 70. The contact trench portion 60 is formed above the region of the base region 14 in the diode portion 80. The contact trench portion 60 is not provided above the well regions 17, which are provided at both ends of the Y axis direction.

The emitter region 12 is provided in contact with the gate trench portion 40. The emitter region 12 is provided to extend from the gate trench portion 40 to the side wall of the contact trench portion 60 in the trench array direction. The emitter region 12 does not need to be provided between the dummy trench portion 30 and the contact trench portion 60.

The emitter region 12 and the first contact portion 151 may be arranged alternately in the trench extending direction, between the gate trench portion 40 and the contact trench portion 60. In the trench extending direction, the width of the first contact portion 151 may be larger than the width of the emitter region 12. The width of the emitter region 12 in the trench extending direction may be 0.6 μm or more and 1.6 μm or less. By appropriately controlling the ratio of the emitter regions 12 and the first contact portions 151, it becomes easy to suppress latch-up.

Figure 8B:
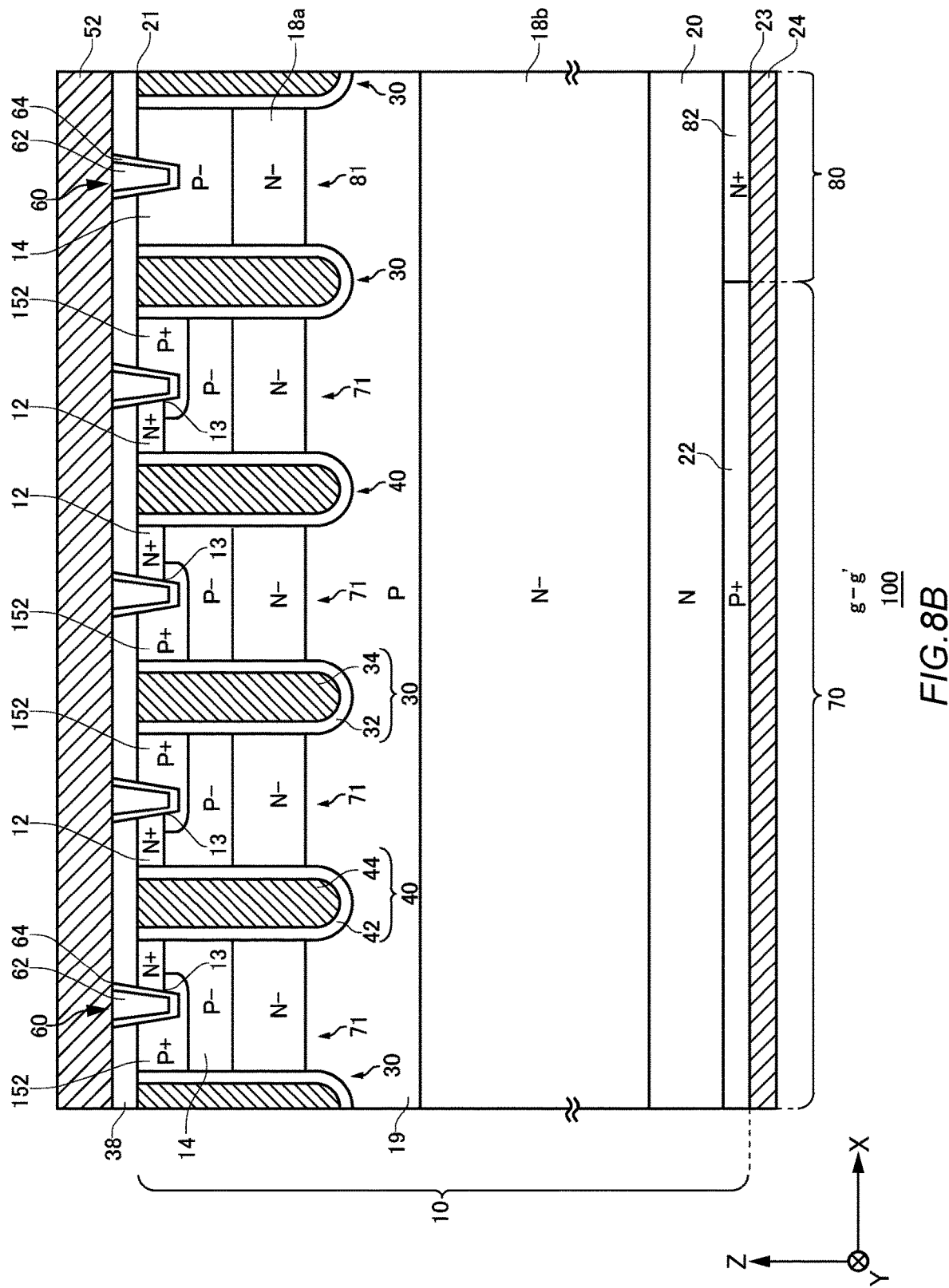
FIG. 8B shows an example of a g-g' cross sectional view in FIG. 8A.

FIG. 8B shows an example of a g-g' cross sectional view in FIG. 8A. The contact trench portion 60 of the present example is formed to be deeper than the emitter region 12.

The contact trench portion 60 is provided to extend to the back surface 23 side of the semiconductor substrate 10 further than the front surface 21. The contact trench portion 60 of the present example is provided to extend to the back surface 23 side of the semiconductor substrate 10 further than the emitter region 12. That is, the lower end of the contact trench portion 60 of the present example is deeper than the lower end of the emitter region 12. The lower end of the contact trench portion 60 of the present example is shallower than the lower end of the second contact portion 152. The contact trench portion 60 may include a plug 62 and a barrier metal layer 64.

The plug 62 is made of a conductive material provided inside the contact trench portion 60. The plug 62 may be made of the same material as the emitter electrode 52, or may be made of a different material. The plug 62 may include a material such as tungsten.

The barrier metal layer 64 is provided below the plug 62. The barrier metal layer 64 of the present example is provided between the plug 62 and the emitter region 12. The barrier metal layer 64 may include a material such as titanium nitride.

The emitter region 12 is provided in contact with the gate trench portion 40. The emitter region 12 may be or may not be in contact with the dummy trench portion 30. The emitter region 12 is provided to extend from the gate trench portion 40 to the side wall of the contact trench portion 60 in the trench array direction. Therefore, the lower-end end portion 13 is positioned on the side wall of the contact trench portion 60, between the gate trench portion 40 and the contact trench portion 60 in the trench array direction.

At least a part of the second contact portion 152 is provided below the lower-end end portion 13 in the mesa portion 71. The second contact portion 152 of the present example is provided to extend from the dummy trench portion 30 to below the lower-end end portion 13 of the emitter region 12 in the trench array direction. The second contact portion 152 may extend beyond the contact trench portion 60 from the dummy trench portion 30 in the trench array direction, or does not need to extend beyond the contact trench portion 60.

A trench bottom region 19 is a region of the second conductivity type, that is provided below the dummy trench portions 30 and the gate trench portions 40. The trench bottom region 19 is of P type, by way of example. The trench bottom region 19 of the present example covers the lower ends of the dummy trench portions 30 and the gate trench portions 40. A doping concentration of the trench bottom region 19 may be higher than or lower than the doping concentration of the base region 14. The trench bottom region 19 is provided between a drift region 18a and a drift region 18b. By providing the trench bottom region 19, the avalanche withstand capability is improved. It is to be noted that the trench bottom region 19 of the present example may be omitted, or may also be applied to other example embodiments.

The drift region 18a is provided between the base region 14 and the trench bottom region 19 in the mesa portion 71 and the mesa portion 81. The drift region 18b is provided below the trench bottom region 19. The doping concentrations of the drift region 18a and the drift region 18b may be the same.

Figure 9A:
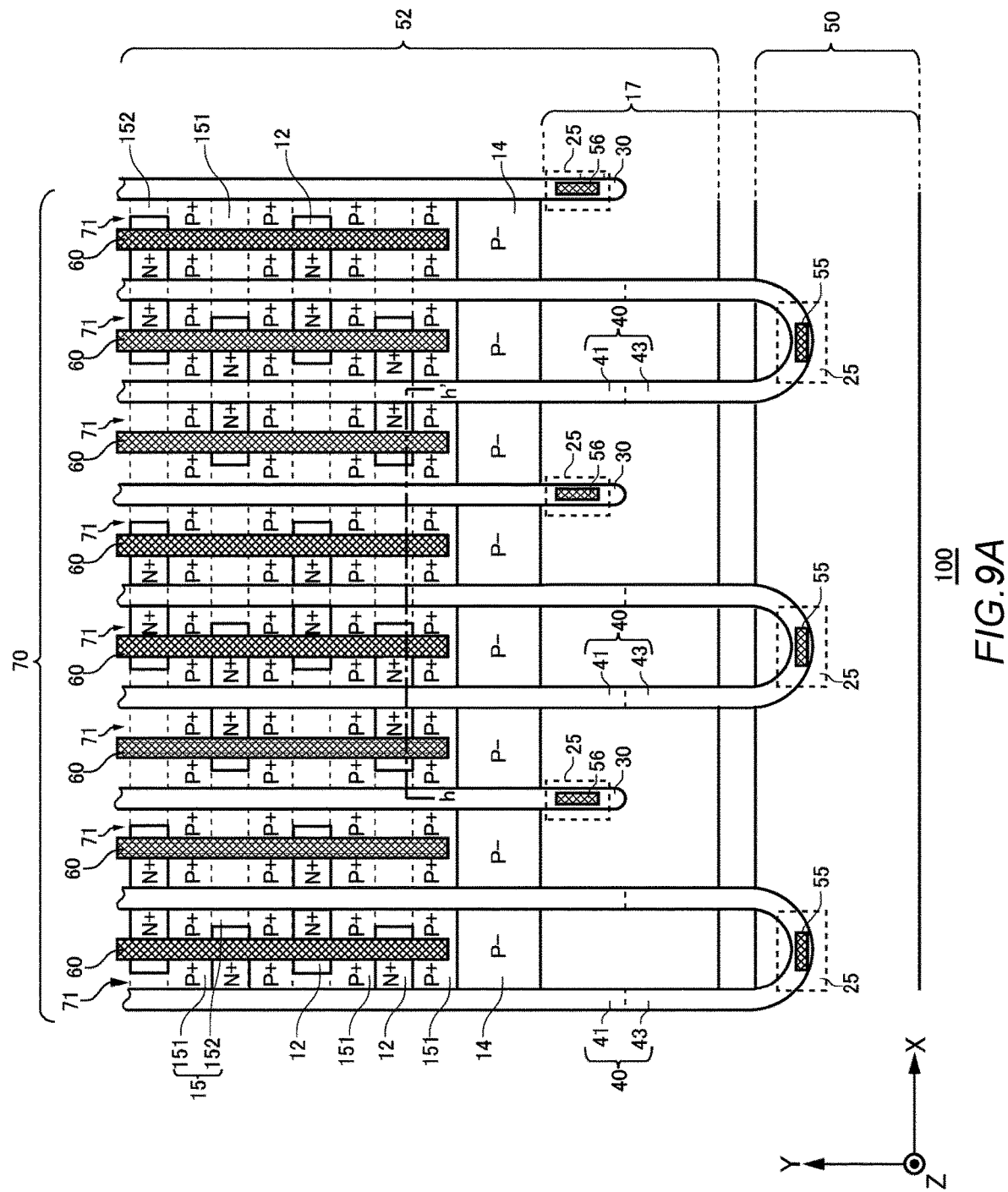
FIG. 9A shows an example of a top view of the semiconductor device 100 according to a modification example.

FIG. 9A shows an example of a top view of the semiconductor device 100 as a modification example. The semiconductor device 100 of the present example is of a case where the first trench portion adjacent to the gate trench portion 40 is the gate trench portion 40, and includes a staggered structure. Although the semiconductor device 100 of the present example does not include the diode portion 80, it may include the diode portion 80. The semiconductor device 100 includes a plurality of gate trench portions 40 provided adjacent to each other. The plurality of gate trench portions 40 provided adjacent to each other may be mutually connected by the connection portion 43.

The plurality of gate trench portions 40 provided adjacent to each other are in contact with the emitter regions 12 at different positions in the trench extending direction. That is, the semiconductor device 100 has the staggered structure and includes the emitter regions 12 that are arrayed alternately. In this case, the adjacent gate trench portions 40 share a portion that becomes the gate trench portion and a portion that becomes the first trench portion. It is to be noted that which trench portion is to be the first trench portion in the adjacent gate trench portions 40 is not limited in particular.

Herein, the first emitter region is the emitter region 12 that is in contact with the gate trench portion 40 and is set apart from the gate trench portion 40 as the first trench portion, in the mesa portion 71 between the adjacent gate trench portions 40. In addition, the second emitter region is the emitter region 12 that is set apart from the gate trench portion 40 and is in contact with the gate trench portion 40 as the first trench portion, in the mesa portion 71.

The contact region 15 may be provided below the lower end of the first emitter region, or may be provided below the lower end of the second emitter region. The first emitter region and the second emitter region are provided alternately in the trench extending direction.

Figure 9B:
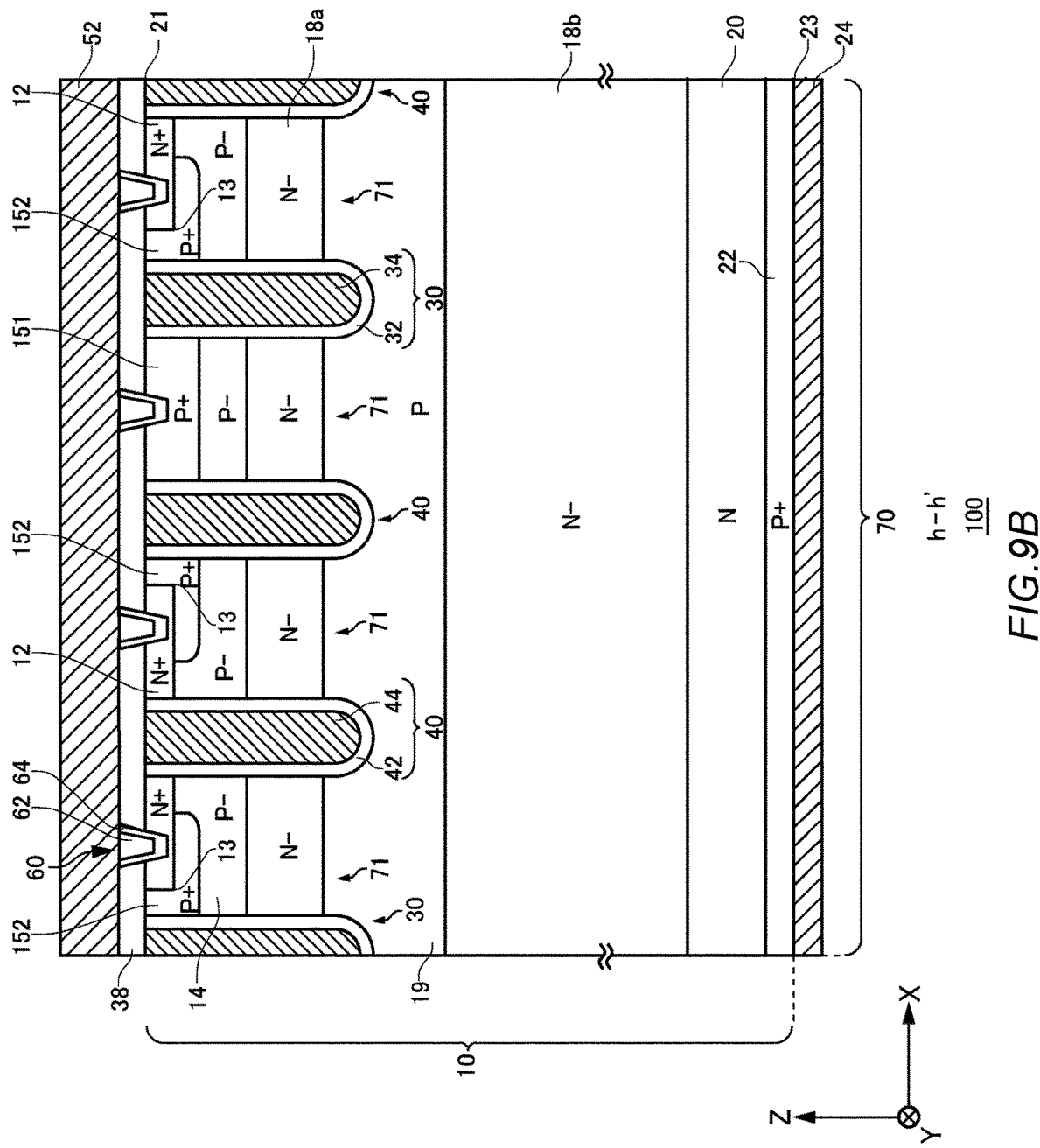
FIG. 9B shows an example of an h-h' cross sectional view in FIG. 9A.

FIG. 9B shows an example of an h-h' cross sectional view in FIG. 9A. The semiconductor device 100 of the present example includes the contact trench portions 60 shallower than the emitter regions 12 and the emitter regions 12 provided at both ends of the contact trench portions 60 in the trench array direction, though the present invention is not limited to this. That is, the semiconductor device 100 may include a contact trench portion 60 deeper than the emitter region 12, and may also include an emitter region 12 provided on one side of the contact trench portion 60. The semiconductor device 100 may or may not include the trench bottom region 19.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 semiconductor substrate
12 emitter region
13 lower-end end portion
14 base region
15 contact region
16 accumulation region
17 well region
18 drift region
19 trench bottom region
20 buffer region
21 front surface
22 collector region 23 back surface
24 collector electrode
25 connecting portion
30 dummy trench portion
31 extending portion
32 dummy dielectric film
33 connection portion
34 dummy conductive portion
38 interlayer dielectric film
40 gate trench portion
41 extending portion
42 gate dielectric film
43 connection portion
44 gate conductive portion
50 gate metal layer
52 emitter electrode
54 contact hole
55 contact hole
56 contact hole
58 contact hole
59 disconnected region
60 contact trench portion
62 plug
64 barrier metal layer
70 transistor portion
71 mesa portion
80 diode portion
81 mesa portion
82 cathode region
92 upper region
94 lower region
100 semiconductor device
130 dummy gate trench portion
132 second gate dielectric film
134 second gate conductive portion
151 first contact portion
152 second contact portion
155 mask
156 thinning region
161 low concentration region
171 high concentration region
181 high concentration region
182 low concentration region
251 first ion implantation region
252 second ion implantation region
253 overlapping ion implantation region.

What is claimed is:

1. A semiconductor device comprising a gate trench portion and a first trench portion adjacent to the gate trench portion, the semiconductor device comprising:
    a drift region of a first conductivity type, which is provided in a semiconductor substrate;
    a base region of a second conductivity type, which is provided above the drift region;
    an emitter region of the first conductivity type, which is provided above the base region and has a doping concentration higher than a doping concentration of the drift region; and
    a contact region of the second conductivity type, which is provided above the base region and has a doping concentration higher than a doping concentration of the base region,
    wherein the contact region includes a first contact portion provided on a front surface of the semiconductor substrate, and a second contact portion which has a doping concentration different from a doping concentration of the first contact portion and is provided alternately with the first contact portion in a trench extending direction on a side wall of the first trench portion.

2. The semiconductor device according to claim 1, wherein
    the first contact portion is provided to extend from the gate trench portion to the first trench portion on the front surface of the semiconductor substrate.

3. The semiconductor device according to claim 1, wherein
    the second contact portion is provided below the emitter region.

4. The semiconductor device according to claim 1, wherein
    the second contact portion is provided to extend from the first trench portion to below a lower end of the emitter region in a trench array direction.

5. The semiconductor device according to claim 4, wherein
    the second contact portion is in contact with the lower end of the emitter region.

6. The semiconductor device according to claim 3, wherein
    the second contact portion is set apart from the gate trench portion, below the emitter region.

7. The semiconductor device according to claim 3, wherein
    the second contact portion is set apart from the gate trench portion by 0.6 μm or more in a trench array direction, below the emitter region.

8. The semiconductor device according to claim 1, wherein
    the first contact portion and the second contact portion are provided on the front surface of the semiconductor substrate at the side wall of the first trench portion.

9. The semiconductor device according to claim 1, wherein
    the doping concentration of the first contact portion is higher than the doping concentration of the second contact portion.

10. The semiconductor device according to claim 1, wherein
    the doping concentration of the first contact portion is lower than the doping concentration of the second contact portion.

11. The semiconductor device according to claim 1, wherein
    the doping concentration of the second contact portion is lower than the doping concentration of the emitter region.

12. The semiconductor device according to claim 1, wherein
    a lower end of the second contact portion is shallower than a lower end of the first contact portion in a depth direction of the semiconductor substrate.

13. The semiconductor device according to claim 1, wherein
    a lower end of the second contact portion is deeper than a lower end of the first contact portion in a depth direction of the semiconductor substrate.

14. The semiconductor device according to claim 1, wherein
    the first contact portion includes a low concentration region having a doping concentration, and a high concentration region which has a doping concentration higher than the doping concentration of the low concentration region and is provided between the low concentration region and the second contact portion on the front surface of the semiconductor substrate, and the doping concentration of the high concentration region is higher than the doping concentration of the second contact portion.

15. The semiconductor device according to claim 1, comprising an interlayer dielectric film provided above the semiconductor substrate, wherein the emitter region is connected to an emitter electrode via a contact hole provided penetrating through the interlayer dielectric film.

16. The semiconductor device according to claim 15, wherein the second contact portion extends beyond the contact hole from the first trench portion in a trench array direction.

17. The semiconductor device according to claim 1, wherein the first trench portion is a dummy trench portion set at an emitter potential.

18. The semiconductor device according to claim 1, wherein the first trench portion includes a dummy gate trench portion which is set at a gate potential and is not in contact with the emitter region.

19. The semiconductor device according to claim 1, wherein the first trench portion is a gate trench portion which is set at a gate potential and is in contact with the emitter region.

20. The semiconductor device according to claim 19, wherein the emitter region includes a first emitter region which is in contact with the gate trench portion and is set apart from the first trench portion in a mesa portion between the gate trench portion and the first trench portion, and the contact region is provided below a lower end of the first emitter region on a side of the first trench portion in the mesa portion.

21. The semiconductor device according to claim 20, wherein the emitter region includes a second emitter region which is in contact with the first trench portion and is set apart from the gate trench portion in the mesa portion, and the contact region is also provided below a lower end of the second emitter region on a side of the gate trench portion in the mesa portion.

22. The semiconductor device according to claim 21, wherein the first emitter region and the second emitter region are alternately provided in the trench extending direction of the gate trench portion.

23. The semiconductor device according to claim 1, wherein in a cross section parallel to the front surface of the semiconductor substrate, at least a part of a boundary between the second contact portion and the base region is spaced apart from a side wall of the gate trench portion, and the boundary has a portion in which a distance between the boundary and the side wall of the gate trench portion decreases as approaching toward the first contact portion from a portion at which the distance is at a maximum.

* * * * *